(12) United States Patent
Sarban et al.

(10) Patent No.: US 11,668,586 B2
(45) Date of Patent: Jun. 6, 2023

(54) DISPLACEMENT SENSOR ASSEMBLY

(71) Applicant: ElastiSense ApS, Aabenraa (DK)

(72) Inventors: Rahimullah Sarban, Brønshøj (DK); Alan Poole, Bække (DK); Benjamin Thomsen, Aabenraa (DK)

(73) Assignee: ELASTISENSE APS, Aabenraa (DK)

( * ) Notice: Subject to any disclaimer, the term of this patent is extended or adjusted under 35 U.S.C. 154(b) by 440 days.

(21) Appl. No.: 16/639,135

(22) PCT Filed: Jul. 13, 2018

(86) PCT No.: PCT/EP2018/069144
§ 371 (c)(1),
(2) Date: Feb. 14, 2020

(87) PCT Pub. No.: WO2019/034344
PCT Pub. Date: Feb. 21, 2019

(65) Prior Publication Data
US 2020/0232821 A1 Jul. 23, 2020

(30) Foreign Application Priority Data
Aug. 18, 2017 (DK) .............................. PA201770626

(51) Int. Cl.
*G01D 3/036* (2006.01)
*G01D 5/241* (2006.01)
(Continued)

(52) U.S. Cl.
CPC .............. *G01D 3/0365* (2013.01); *G01B 7/22* (2013.01); *G01D 5/241* (2013.01); *H05K 1/18* (2013.01); *H05K 2201/09063* (2013.01)

(58) Field of Classification Search
CPC ......... G01D 5/241; G01D 3/0365; G01D 7/22
See application file for complete search history.

(56) References Cited

U.S. PATENT DOCUMENTS

| 4,384,496 A | 5/1983 | Gladwin |
| 9,390,061 B1 * | 7/2016 | Deeds ................ G01R 27/2605 |

(Continued)

FOREIGN PATENT DOCUMENTS

| WO | 2005/089134 A2 | 9/2005 |
| WO | 2016/030752 A1 | 3/2016 |

OTHER PUBLICATIONS

International Search Report and Written Opinion dated Oct. 30, 2018 for PCT/EP2018/069144 filed on Jul. 13, 2018, 15 pages.
(Continued)

*Primary Examiner* — Jeff W Natalini
(74) *Attorney, Agent, or Firm* — Xsensus LLP

(57) ABSTRACT

Disclosed is a sensor assembly comprising: a first mounting device for mounting the sensor assembly to a first fixation part; a second mounting device for mounting the sensor assembly to a second fixation part, the second fixation part being displaceable relative to the first fixation part; and a sensor device arranged in a sensor cavity for provision of a sensor signal, the sensor device comprising a first attachment part attached to the first mounting device, a second attachment part attached to the second mounting device, and a sensing part, the sensing part being arranged between the first attachment part and the second attachment part.

15 Claims, 16 Drawing Sheets

(51) Int. Cl.
*H05K 1/18* (2006.01)
*G01B 7/16* (2006.01)

(56) References Cited

U.S. PATENT DOCUMENTS

| | | | |
|---|---|---|---|
| 2003/0196495 A1* | 10/2003 | Saunders | B60R 21/01516 |
| | | | 73/1.13 |
| 2006/0065973 A1 | 3/2006 | Dallenbach et al. | |
| 2007/0205776 A1* | 9/2007 | Harish | G01G 23/3735 |
| | | | 324/662 |
| 2009/0205437 A1 | 8/2009 | Dallenbach et al. | |
| 2009/0301215 A1 | 12/2009 | McDearmon et al. | |
| 2016/0327392 A1* | 11/2016 | Kim | G01P 15/0802 |

OTHER PUBLICATIONS

Danish 1st Technical Examination and Search Report dated Feb. 8, 2018 for DK Patent Application No. PA201770626 filed on Aug. 18, 2017, 5 pages.

* cited by examiner

DISPLACEMENT SENSOR ASSEMBLY

CROSS-REFERENCE TO RELATED APPLICATIONS

The present application is based on PCT filing PCT/EP2018/069144, filed Jul. 13, 2018, which claims priority to DK PA201770626, filed Aug. 18, 2017, the entire contents of each are incorporated herein by reference.

The present invention relates to a sensor assembly, and in particular to a sensor assembly for operation in aggressive environmental conditions.

BACKGROUND

High-precision displacement sensors being able to operate in mechanically and environmentally aggressive and varying environmental conditions are challenging to realize with conventional sensing technologies without adding complex and sometime expensive precautional measures. This limits effective displacement monitoring and control of systems and machines operating in such aggressive environment.

SUMMARY

There is a need for high precision measurements of distance between two moving parts moving in relation to each other in a highly aggressive environment thereby improving the quality of measurements and in turn improving the control of machinery in need of such high precision measurements.

Accordingly, a sensor device for provision of a sensor signal is disclosed. The sensor device comprising a first attachment part for attachment to a first mounting device, a second attachment part for attachment to a second mounting device, and a sensing part arranged between the first attachment part and the second attachment part.

A longitudinal direction of the sensing device being from the first attachment part to the second attachment part. A first transverse direction being perpendicular to the longitudinal direction. A second transverse direction being perpendicular to the longitudinal direction and the first transverse direction.

The sensing part comprises a sensing zone and optionally one or more non-sensing zones. The sensor signal is indicative of stretching of the sensing zone.

Also disclosed is a sensor assembly. The sensor assembly comprises: a first mounting device for mounting the sensor assembly to a first fixation part and a second mounting device for mounting the sensor assembly to a second fixation part. The second fixation part being displaceable relative to the first fixation part.

The sensor assembly comprises a sensor device, such as the above disclosed sensor device, arranged in a sensor cavity for provision of a sensor signal. The sensor device comprises a first attachment part attached to the first mounting device, a second attachment part attached to the second mounting device, and a sensing part. The sensing part being arranged between the first attachment part and the second attachment part.

The sensor assembly may comprise a compensation sensor structure and a compensation sensor for provision of a compensation signal. The compensation sensor is arranged in the sensor cavity and comprises a compensation part being supported by the compensation sensor structure.

Also disclosed is a method of determining displacement between a first fixation part and a second fixation part. The method comprises determining the displacement with a sensor assembly, such as the above disclosed sensor assembly. The sensor assembly comprises a first mounting device, a second mounting device, a sensor device and an optional compensation sensor. The method comprises: mounting the first mounting device to the first fixation part; mounting the second mounting device to the second fixation part; arranging, in a sensor cavity, a sensing part of the sensor device between the first mounting device and the second mounting device; and optionally arranging, in the sensor cavity, a compensation sensor comprising a compensation part.

The method further comprising: obtaining a sensor signal from the sensor device; optionally obtaining a compensation signal from the compensation sensor; and determining a displacement parameter based on the sensor signal and optionally the compensation signal.

The disclosure provides for more precise measurements of displacements. Particularly, the disclosure provides for enhanced displacement measurements in harsh environments. Furthermore, the disclosure provides for enhanced precision of measurements, particularly over longer distances between displacing elements.

The sensor device may have a width along the first transverse direction. The width of the sensor device along the first transverse direction may be more than 5 mm, such as more than 10 mm, such as more than 20 mm.

The sensor device may have a thickness along the second transverse direction. The thickness of the sensor device along the second transverse direction may be less than 2 mm, such as less than 1 mm.

The sensor device, such as the sensing part of the sensor device, may be stretchable, e.g. along the longitudinal direction. The sensor device may be able to stretch from a first position with a first length to a second position with a second length. The second length may be at least 10% longer than the first length, such at least 30% longer.

The sensor device comprises a sensing zone, e.g. the sensing part of the sensor device may comprise the sensing zone. The sensing part may comprise a capacitive sensing zone. The sensor signal may be indicative of stretching, e.g. the length, of the sensing zone. The sensing zone may be a capacitive sensing zone. The sensor signal may be indicative of the capacitance of the sensing zone. The sensor signal may be based on capacitance of the sensing part.

A length of the sensor device or part thereof may be provided along the longitudinal direction. The length of the sensing zone in the longitudinal direction may be less than the length of the sensing part in the longitudinal direction. For example, the length of the sensing zone may be less than 80% of the length of the sensing part, such as less than 50%, such as less than 20%.

The sensor device may comprise one or more non-sensing zones, e.g. the sensing part of the sensor device may comprise the one or more non-sensing zones. The non-sensing zones may be non-capacitive zones. The one or more non-sensing zone may comprise a first non-sensing zone, a second non-sensing zone, a third non-sensing zone and/or a fourth non-sensing zone. The sensing zone may be joined to the one or more non-sensing zones. For example, the sensing zone may be joined to the first non-sensing zone, the second non-sensing zone, the third non-sensing zone and/or the fourth non-sensing zone.

The first attachment part and/or the second attachment part may form part of the one or more non-sensing zones. The first attachment part and/or the second attachment part may be joined with the one or more non-sensing zones. The first attachment part may be joined to the first non-sensing zone. The second attachment part may be joined to the second non-sensing zone. Elasticity of the first attachment part and/or the second attachment part may be different than the elasticity of the sensing part. Elasticity of the sensing part may be more than elasticity of the first attachment part and/or the second attachment part. The first attachment part and/or the second attachment part may be more rigid than the sensing part.

The sensing zone may be positioned at a distance from the borders of the sensing part. The non-sensing zones, such as the first non-sensing zone, the second non-sensing zone, the third non-sensing zone and/or the fourth non-sensing zone, may be utilized for positioning the sensing zone at a distance from the borders of the sensing part. Positioning the sensing zone at a distance from the borders of the sensing part may provide for a more linear deformation of the sensing zone upon stretching of the sensor device.

The length of the sensing zones along the longitudinal direction, such as the first non-sensing zone and/or the second non-sensing zone may be based on the width of the sensing part, e.g. along the first transverse direction. For example, the length of the first non-sensing zone and/or the length of the second non-sensing zone in the longitudinal direction may be more than 20% of the width of the sensing part along the first transverse direction. The width of the sensing part may be determinant for a distance from the first and/or second attachment part where the deformation of the sensing part is predominantly linear.

The sensing zone may be positioned closer to the first attachment part than to the second attachment part. The second non-sensing zone may be longer than first non-sensing zone. The second non-sensing zone may be longer than the sensing zone. The second non-sensing zone may be prolonged to provide a longer sensor device while maintaining the length of the sensing zone.

The width of the sensing zone, such as in the first transverse direction, may be less than the width of the sensing part, such as in the first transverse direction. For example, the width of the sensing zone, such as along the first transverse direction, may be less than 80% of the width of the sensing part, such as along the first transverse direction.

The sensing zone may be arranged, such as along the first transverse direction, between the third non-sensing zone and the fourth non-sensing zone. The third non-sensing zone and/or the fourth non-sensing zone may be more than 10% of the width of the sensing part, such as along the first transverse direction, such as more than 15% of the width of the sensing part, such as more than 20% of the width of the sensing part. The width of third non-sensing zone and the width of the fourth non-sensing zone, such as along the first transverse direction, may be the same width.

The sensor device may have a stiffness. The stiffness of the sensor device may vary between different zones of the sensor device, such as along the length of the sensor device, such as along the longitudinal direction. The stiffness of the sensing zone and stiffness of the one or more non-sensing zones, such as one or more of the one or more non-sensing zones, such as the first non-sensing zone, the second non-sensing zone, the third non-sensing zone and/or the fourth non-sensing zone, may be different. The stiffness of the sensing zone may be less than the stiffness of the one or more non-sensing zones, such as one or more of the one or more non-sensing zones, such as the first non-sensing zone, the second non-sensing zone, the third non-sensing zone and/or the fourth non-sensing zone.

The sensor device, such as the sensing part and/or the sensing zone may comprise a plurality of sensor layers, such as along the second transverse direction. The sensor layers may be polymeric layers. The plurality of sensor layers may comprise one or more of a first primary protective layer, a first secondary protective layer, a first ground electrode layer, a first dielectric layer, a signal electrode layer, a second dielectric layer, a second ground electrode layer, a second secondary protective layer, and/or a second primary protective layer.

The sensor device may comprise one or more terminals, such as a first terminal and/or a second terminal, such as a first ground terminal and/or a second ground terminal and/or a signal terminal. The first ground terminal and the second ground terminal may be connected to form a ground terminal, such as a single ground terminal.

The first ground electrode layer and/or the second ground electrode layer may be connected to the first terminal, such as the ground terminal. The first ground electrode layer may have a first active ground part. The second ground electrode layer may have a second active ground part. The first active ground part and/or the second active ground part may be connected to the first terminal, such as the ground terminal.

The signal electrode layer may be connected to the second terminal, such as the signal terminal. The signal electrode layer may have an active signal part. The signal electrode layer may have a non-active signal part. The active signal part may be connected to the second terminal, such as the signal terminal. The active signal part and the first active ground part, and optionally the second active ground part, may be overlapping throughout the sensing zone. The sensing zone may be defined by the overlap of the active signal part and the first active ground part and optionally the second active ground part.

The first dielectric layer may separate the signal electrode layer and the first ground electrode layer. The second dielectric layer may separate the signal electrode layer and the second ground electrode layer.

The first primary protective layer may cover the first ground electrode layer, e.g. the first primary protective layer may cover the first ground electrode layer opposite the first dielectric layer. The second primary protective layer may cover the second ground electrode layer, e.g. the second primary protective layer may cover the second ground electrode layer opposite the second dielectric layer. The first primary protective layer and/or the second primary protective layer may be a dielectric material, such as an electrically insulating material. The first primary protective layer and/or the second primary protective layer may be the same material as the first dielectric layer and/or the second dielectric layer. The first primary protective layer and/or the second primary protective layer may have a width, e.g. along the first transverse direction, wider than the width of the first ground electrode layer, the signal electrode layer and/or the second ground electrode layer.

The first secondary protective layer may cover the first primary protective layer, e.g. the first secondary protective layer may cover the first primary protective layer opposite the first ground electrode layer. The second secondary protective layer may cover the second primary protective layer, e.g. the second secondary protective layer may cover the second primary protective layer opposite the second ground electrode layer. The first secondary protective layer and/or the second secondary protective layer may have a width, e.g. along the first transverse direction, wider than the width of the first ground electrode layer, the signal electrode layer and/or the second ground electrode layer.

The first ground electrode layer, the signal electrode layer and/or the second ground electrode layer may be made from a conductive glue. The first ground electrode layer, the signal electrode layer and/or the second ground electrode layer may be sprayed, printed, and/or deposited with any other deposition method onto a neighbouring layer, such as a dielectric layer.

For example, the second ground electrode layer may be sprayed onto the second primary protective layer, the second dielectric layer may be positioned and glued onto the second primary protective layer by the conductive glue forming the second ground electrode layer. The signal electrode layer may be sprayed onto the second dielectric layer, the first dielectric layer may be positioned and glued onto the second dielectric layer by the conductive glue forming the signal electrode layer. The first ground electrode layer may be sprayed onto the first dielectric layer, the first primary protective layer may be positioned and glued onto the first dielectric layer by the conductive glue forming the first ground electrode layer.

The first dielectric layer, the second dielectric layer, the first primary protective layer and/or the second primary protective layer may have a thickness, e.g. along the second transverse direction, between 0.01-0.3 mm, such as between 0.02-0.2 mm.

The first dielectric layer, the second dielectric layer, the first primary protective layer and/or the second primary protective layer may be a silicone rubber. For example, the first dielectric layer, the second dielectric layer, the first primary protective layer and/or the second primary protective layer may be ELASTOSIL film of Wacker Chemie AG.

The first secondary protective layer and/or the second secondary protective layer may have a thickness, e.g. along the second transverse direction, between 0.05-0.5 mm, such as between 0.2-0.3 mm, such as 0.25 mm.

Stretching the sensor device in the longitudinal direction will change the dimensions of the dielectric layers in the longitudinal direction, the first transverse direction, and/or the second transverse direction, thereby changing the capacitance measured between the signal electrode layer and the ground electrode layers. The amount of stretching of the sensor device is therefore measurable by measuring the capacitance between the signal electrode layer and the ground electrode layers.

The one or more non-sensing zones, such as one or more of the one or more non-sensing zones, such as the first non-sensing zone, the second non-sensing zone, the third non-sensing zone and/or the fourth non-sensing zone may comprise the plurality of sensor layers along the second transverse direction.

The one or more non-sensing zones, such as the one or more of the one or more non-sensing zones, such as the first non-sensing zone, the second non-sensing zone, the third non-sensing zone and/or the fourth non-sensing zone, may comprise a void section joining the sensing zone. The void section may provide an electrically insulating gap between the sensing zone and the one or more non-sensing zones, such as the one or more of the one or more non-sensing zones, such as the first non-sensing zone, the second non-sensing zone, the third non-sensing zone and/or the fourth non-sensing zone. The void section may provide that capacitance of the non-sensing zones are not influencing the measured capacitance, such as the measured capacitance of the sensing zone. The void section may be provided in the signal electrode layer, the first ground electrode layer and/or the second ground electrode layer. The void section may be provided in the signal electrode layer, such as only in the signal electrode layer. Only providing the void section in the signal electrode layer may provide for increased mechanical strength of the sensor device and more uniform elasticity of the sensor device. The void section may provide an electrically insulating gap between the active signal part and the non-active signal part of the signal electrode layer.

A sensor assembly is disclosed comprising the sensor device. The sensor assembly may comprise a compensation sensor. The compensation sensor may be similar to the sensor device. For example, the compensation sensor may comprise the same layers as the sensor device, such as the plurality of sensor layers. The compensation sensor may have a different length than the sensor device. The compensation sensor may have the same capacitive properties as the sensor device e.g. by utilizing dielectric layers with similar dielectric properties as those utilized in the sensor device. For example, the compensation sensor may have the same capacitive properties as the sensor device while being subjected to the same environmental conditions, such as humidity, pressure and/or temperature. The compensation sensor, such as the compensation part, may comprises a capacitive compensation zone.

The compensation sensor may be arranged to be restricted from mechanical deformation caused by relative displacement between the first fixation part and the second fixation part. The compensation sensor may indicate change of capacitance, such as change of capacitance of the sensor device, due to environmental conditions, such as temperature, humidity and/or pressure.

The compensation sensor and the sensor device may have same geometry, such as the same thickness and/or width. The compensation sensor, such as the compensation part, may be made of the same material as the sensor device, such as the sensing part. The compensation sensor and sensor device, such as the sensor part and/or the sensing zone, may have different geometries, but same material, i.e. same dielectric properties during same temperature and humidity conditions. Same geometries simplify calculations. Different geometries may provide more flexibility in positioning of the sensor device and/or compensation sensor.

The compensation sensor structure may comprise a suspension arrangement. The compensation sensor may be suspended in the suspension arrangement. The suspension arrangement may comprise one or more suspension openings, such as a first suspension opening and/or a second suspension opening, for subjecting the compensation part to environmental conditions of the sensor cavity, such a humidity, pressure and/or temperature. The suspension arrangement may comprise a first suspension opening for subjecting a first surface of the compensation part to environmental condition of the sensor cavity. The suspension arrangement may comprise a second suspension opening for subjecting a second surface of the compensation part to environmental condition of the sensor cavity. The suspension openings may be covered by a mesh. For example, the first suspension opening may be covered by a first mesh and/or the second suspension opening may be covered by a second mesh. The mesh, such as the first mesh and/or the second mesh, may provide a protective cover for the compensation sensor, such as the compensation part, while subjecting the compensation sensor, such as the compensation part, to the environmental conditions of the sensor cavity.

The sensor assembly may comprise one or more printed circuit boards, such as a plurality of printed circuit boards, e.g. including a compensation printed circuit board, a sensor printed circuit board, and/or one or more controller printed circuit boards. Printed circuit boards may be utilized to eliminate or at least reduce the needs for wires, e.g. to reduce the risk of electrical noise. Printed circuit boards furthermore provide for a more rigid and durable assembly.

The compensation sensor structure may comprise the compensation printed circuit board. The compensation printed circuit board may have rigid terminals. The rigid terminals of the compensation printed circuit board may be connected, such as fixedly connected, with terminals of the compensation sensor, such as of the compensation part.

The first mounting device may comprise the sensor printed circuit board. The sensor printed circuit board may have rigid terminals. The rigid terminals of the sensor printed circuit board may be connected, such as fixedly connected, with terminals of the sensor device, such as of the sensor part.

The first mounting device may comprise the one or more controller printed circuit boards. The one or more controller printed circuit boards may be connected with the compensation printed circuit board and/or the sensor printed circuit board.

The sensor assembly may be configured to provide an output signal. The output signal may be indicative of stretching of the sensing part. The output signal may be based on the sensor signal. The output signal may be based on the compensation signal. The output signal may be based on the sensor signal and the compensation signal. For example, the output signal may be the result of the subtraction of the compensation signal from the sensor signal. Alternatively, the output signal may be the result of multiplication of the sensor signal with change in compensation signal relative to initial value of the compensation signal measured at a defined environmental condition, e.g. during initial calibration of the compensation sensor. Other mathematical operations e.g. combination of multiplication, subtraction, and addition could be applied in order to provide a more precise measurement and/or preserve precision in highly varying environmental conditions such as high variation in temperature, humidity, and/or pressure. The sensor signal may be based on capacitance, such as measured capacitance, of the sensing part, such as the sensing zone. The compensation signal may be based on capacitance, such as measured capacitance, of the compensation part.

The sensor assembly may comprise a cover structure. The cover structure may have a first end and a second end. The first end may be attached to the first mounting device. The second end may be attached to the second mounting device. The sensor cavity may be defined by the cover structure, the first mounting device and the second mounting device. The cover structure may protect the sensor device and/or the compensation sensor from dust, particles and other harmful materials in the surrounding environment of the sensor assembly. The cover structure may be a cylinder. The cover structure may be able to extend in the longitudinal direction. For example, the cover structure may be a bellows cylinder or a telescopic cylinder.

The sensor assembly may comprise a reference sensor. The reference sensor may comprise a temperature sensor, a pressure sensor and/or a humidity sensor. The reference sensor may be provided on the first mounting device, e.g. on a controller printed circuit board. The reference sensor may provide for detection of errors in the measurement of the compensation sensor. For example, the compensation sensor may be affected if particles enter the sensor cavity, e.g. if the cover structure is faulty. In such situation, the measurement of the compensation sensor may be outside a reasonable range determined by the reference sensor, and the faulty cover structure may be detected and communicated.

Arranging the sensing part of the sensor device between the first mounting device and the second mounting device may comprise attaching the first attachment part to the first mounting device, e.g. by a first clamp member of the first mounting device. The first attachment part may be attached to the first mounting device, e.g. by the first clamp member. Arranging the sensing part of the sensor device between the first mounting device and the second mounting device may comprise attaching the second attachment part to the second mounting device, e.g. by a second clamp member of the second mounting device. The second attachment part may be attached to the second mounting device, e.g. by the second clamp member.

Obtaining the sensor signal from the sensor device may comprise exciting the sensor part with a constant pulse current. The sensor signal may be obtained by measuring the voltage change, e.g. indicating capacitance. The excitation current frequency may be more than 1.000 Hz, such as more than 5.000 Hz, such as 10.000 Hz or 100.000 Hz.

Obtaining the compensation signal from the compensation sensor may comprise exciting the compensation part with a constant pulse current. The compensation signal may be obtained by measuring the voltage change, e.g. indicating capacitance. The excitation current frequency may be more than 1.000 Hz, such as more than 5.000 Hz, such as 10.000 Hz or 100.000 Hz.

Determining the displacement parameter may be based on the sensor signal and the compensation signal. For example, the displacement parameter may be based on a subtraction of the compensation signal from the sensor signal. Alternatively, the displacement parameter may be based on multiplication of the sensor signal with change in compensation signal relative to an initial value of the compensation signal measured at a defined environmental condition, e.g. during initial calibration of the compensation sensor. Other mathematical operations e.g. combination of multiplication, subtraction, and addition could be applied in order to provide a more precise measurement and/or preserve precision in highly varying environmental conditions such as high variation in temperature, humidity, and/or pressure.

Any feature described above in relation to any one aspect of the disclosure is applicable also to any other aspect of the disclosure, mutatis mutandis.

Embodiments of the invention will be described in more detail in the following with regards to the accompanying figures. The figures show one way of implementing the present invention and are not to be construed as being limiting to other possible embodiments falling within the scope of the attached claim set.

DETAILED DESCRIPTION

Figure 1:
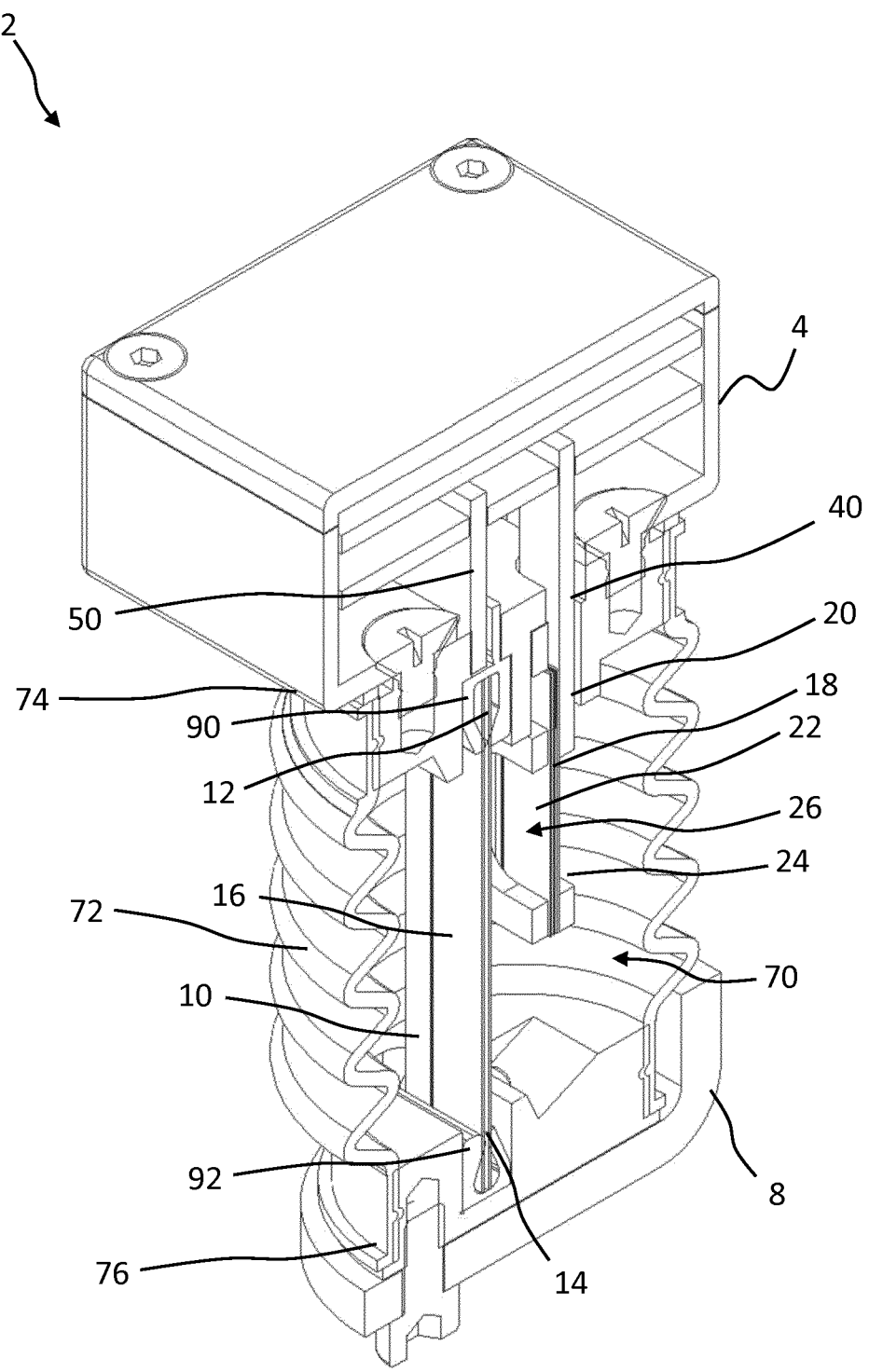
FIG. 1 shows a schematic illustration of an exemplary sensor assembly.

FIG. 1 shows a schematic illustration of an exemplary sensor assembly 2.

The sensor assembly 2 comprises a first mounting device 4 and a second mounting device 8. The first mounting device 4 is configured for mounting the sensor assembly to a first fixation part (not shown). The second mounting device 8 is configured for mounting the sensor assembly to a second fixation part. The second fixation part is displaceable relative to the first fixation part. For example, the first fixation part may be a stationary part of an apparatus and the second fixation part may be a movable part of the apparatus. Hence, the first mounting device 4 and the second mounting device 8 are configured to be mounted on two elements configured for being displaced relative to each other, e.g. linearly displaced relative to each other.

The sensor assembly 2 comprises a sensor device 10. The sensor device 10 is arranged in a sensor cavity 70. The sensor device 10 is configured for providing a sensor signal. The sensor device 10 comprises a first attachment part 12, a second attachment part 14 and a sensing part 16. The sensing part 16 is arranged between the first attachment part 12 and the second attachment part 14.

The sensor device is attached to the first mounting device 4 and the second mounting device 8. The first attachment part 12 is attached to the first mounting device 4, e.g. by a first clamp member 90 as shown. The second attachment part 14 is attached to the second mounting device 8, e.g. by a second clamp member 92 as shown.

Thus, by movement of the second mounting device 8 away from the first mounting device 4, i.e. increasing the distance between the first mounting device 4 and the second mounting device 8, the sensor device 10, such as the sensing part 16 of the sensor device, will be stretched. As will be further explained in relation to following figures, stretching of the sensing part 16 incur changes of electrical properties, such as capacitance, of the sensing part. The sensor signal may reflect this change. Thereby the position of the second mounting device 8 relative to the first mounting device 4 may be determined.

The exemplary sensor assembly 2 furthermore comprises a compensation sensor structure 20 and a compensation sensor 18. The compensation sensor 18 is configured for provision of a compensation signal. The compensation sensor 18 is arranged in the sensor cavity 70. The compensations sensor comprises a compensation part 22. The compensation part 22 is supported by the compensation sensor structure 20.

The compensation part 22 may be made of the same material as the sensing part 16. The compensation sensor 18 is arranged such that it is not affected, e.g. stretched due to movement of the second mounting device 8 relative to the first mounting device 4. The compensation sensor 18, being provided in the sensor cavity 70, is subjected to the same environmental conditions, e.g. temperature, pressure and/or humidity, as the sensor device. Thereby change of electrical properties, such as capacitance, of the compensation sensor 18 is caused by environmental conditions in the sensor cavity 70. The sensor signal may thereby be corrected for changing environmental conditions based on the compensation signal.

In the exemplary sensor assembly 2, the compensation sensor 18 is suspended in a suspension arrangement 24 of the compensation sensor structure 20.

The suspension arrangement 24 comprises a first suspension opening 26 for directly subjecting a first surface of the compensation part 22 to the environmental condition of the sensor cavity 70. However, in another exemplary sensor assembly, the compensation part 22 may be enclosed by the suspension arrangement.

In the exemplary sensor assembly 2, the compensation sensor structure 20 comprises a compensation printed circuit board 40 for connection with the compensation sensor 18.

The exemplary sensor assembly 2 comprises a sensor printed circuit board 50 for connection with the sensor device 10. The sensor printed circuit board may be comprises by the first mounting device 4.

The exemplary sensor assembly 2 comprises a cover structure 72. The cover structure 72 has a first end 74 and a second end 76. The first end 74 is attached to the first mounting device 4 and the second end 76 is attached to the second mounting device 8. In the presented example, the cover structure 72 is shown as a bellow structure. However, other alternative cover structures 72 may be used, e.g. the cover structure 72 may be a telescopic cylinder, or a stretchable tube. The sensor cavity 70 may be defined by the cover structure 72, the first mounting device 4 and the second mounting device 8.

Figure 2A:
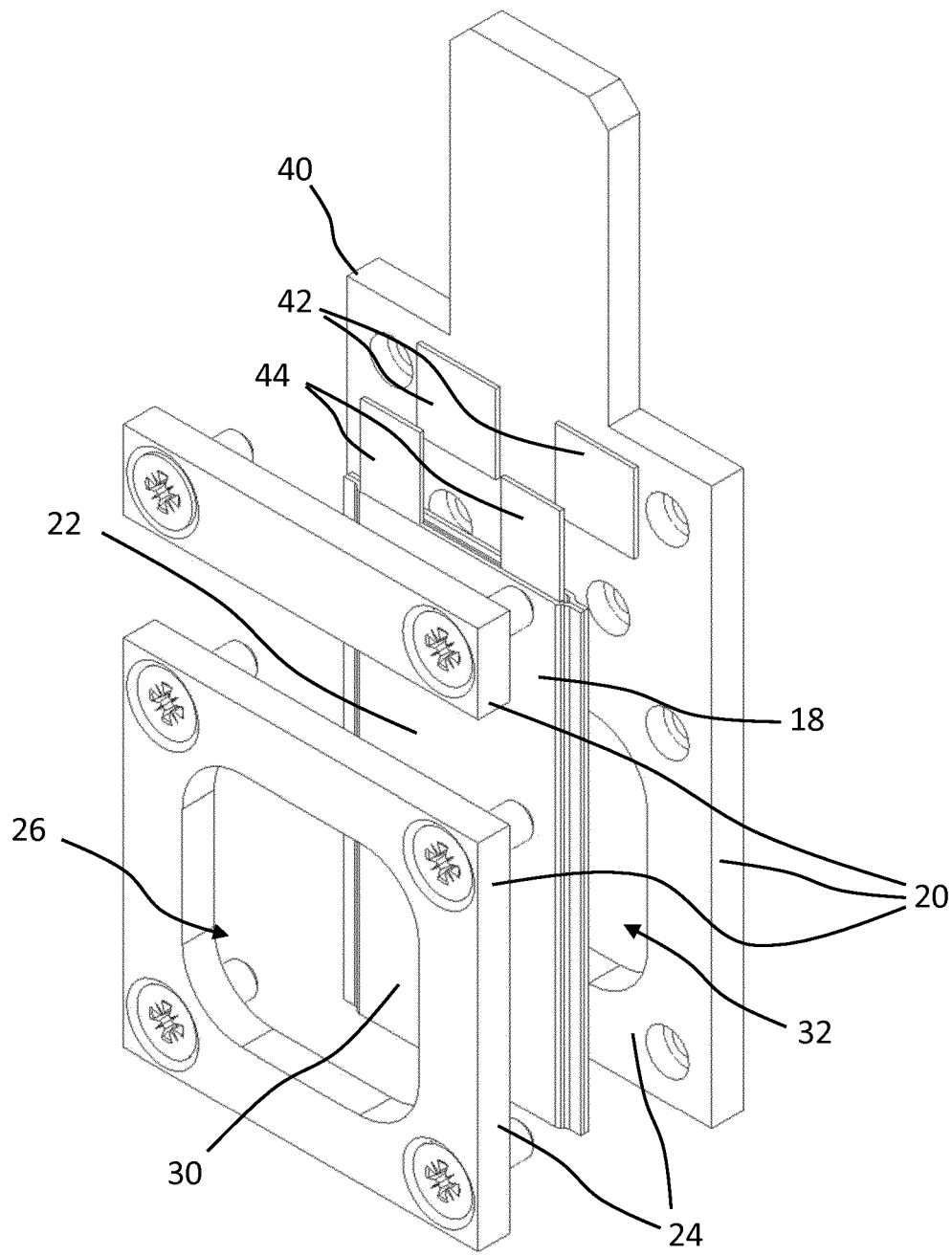
FIG. 2 shows schematic illustrations of exemplary compensation sensors and compensation sensor structures.
Figure 2B:
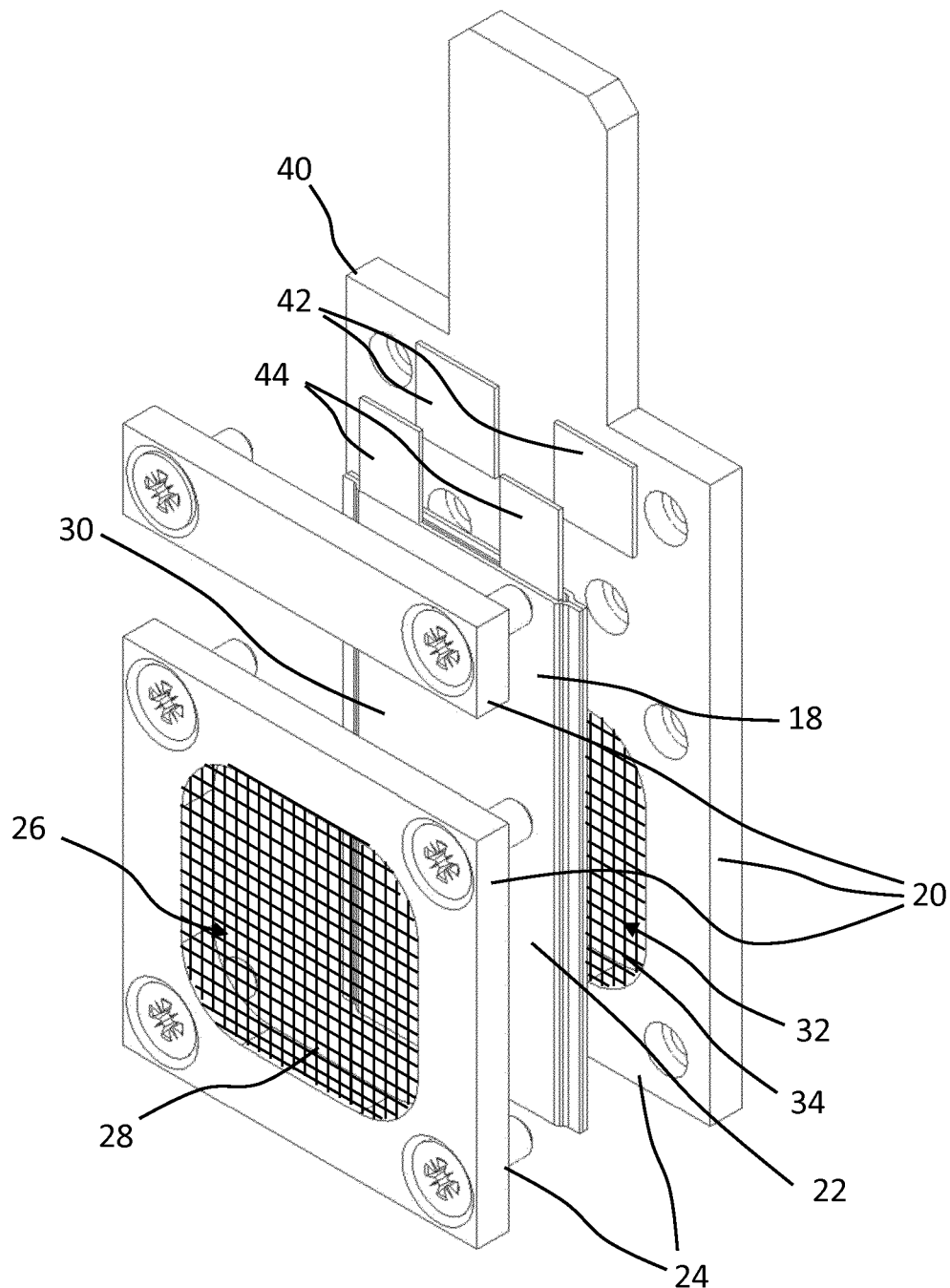
Figure 2C:
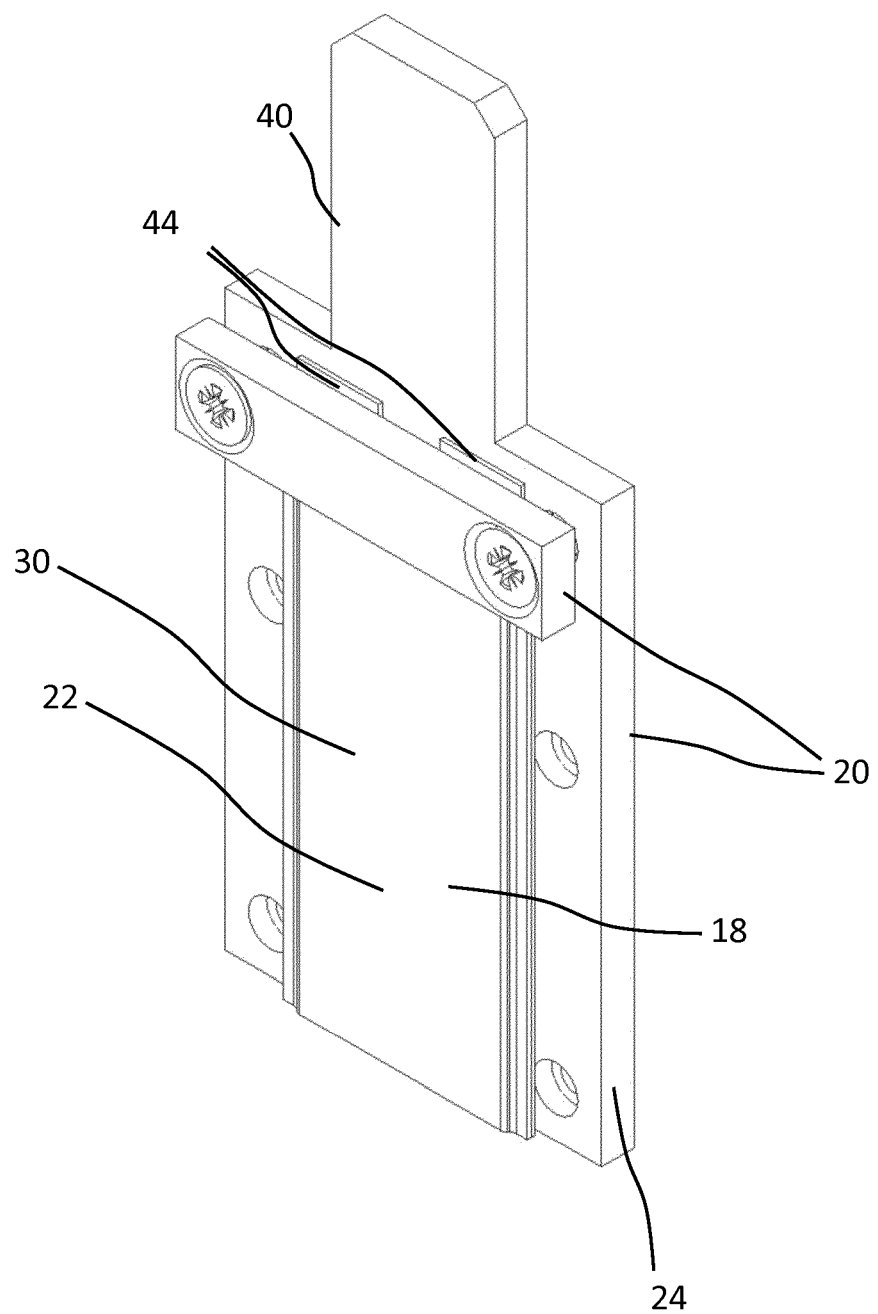

FIG. 2a-c shows schematic illustrations of exemplary compensation sensors 18 and compensation sensor structures 20.

FIG. 2a shows a schematic illustration of an exemplary compensation sensor 18 and a compensation sensor structure 20, wherein the suspension arrangement 24 comprises a first suspension opening 26 and a second suspension opening 32. The first suspension opening 26 provides for directly subjecting a first surface 30 of the compensation part 22 to environmental conditions, such as environmental conditions of the sensor cavity. The second suspension opening 32 provides for directly subjecting a second surface (e.g. opposite the first surface 30) of the compensation part 22 to environmental conditions, such as environmental conditions of the sensor cavity.

It will be readily understood that the suspension arrangement 24 may alternatively comprise only one suspension opening, such as the first suspension opening 26.

FIG. 2b shows a schematic illustration of an exemplary compensation sensor 18 and a compensation sensor structure 20, similar to that of FIG. 2a, wherein the first suspension opening 26 is covered by a first mesh, and the second suspension opening 32 is covered by a second mesh.

It will be readily understood that the suspension arrangement 24 may alternatively comprise only one suspension opening being covered by a mesh, such as the first suspension opening 26 being covered by the first mesh.

FIG. 2c shows a schematic illustration of an exemplary compensation sensor 18 and a compensation sensor structure 20, wherein the first surface 30 of the compensation part 22 is uncovered by suspension arrangement 24. The suspension arrangement 24 may provide a surface for attaching the compensation sensor, e.g. by gluing the second surface of the compensation part 22 onto the suspension arrangement 24.

FIG. 2a-c furthermore show the compensation sensor structure 20 comprising a compensation printed circuit board 40. The compensation printed circuit board 40 has rigid terminals 42 for connection with terminals 44 of the compensation sensor 18.

Figure 3:
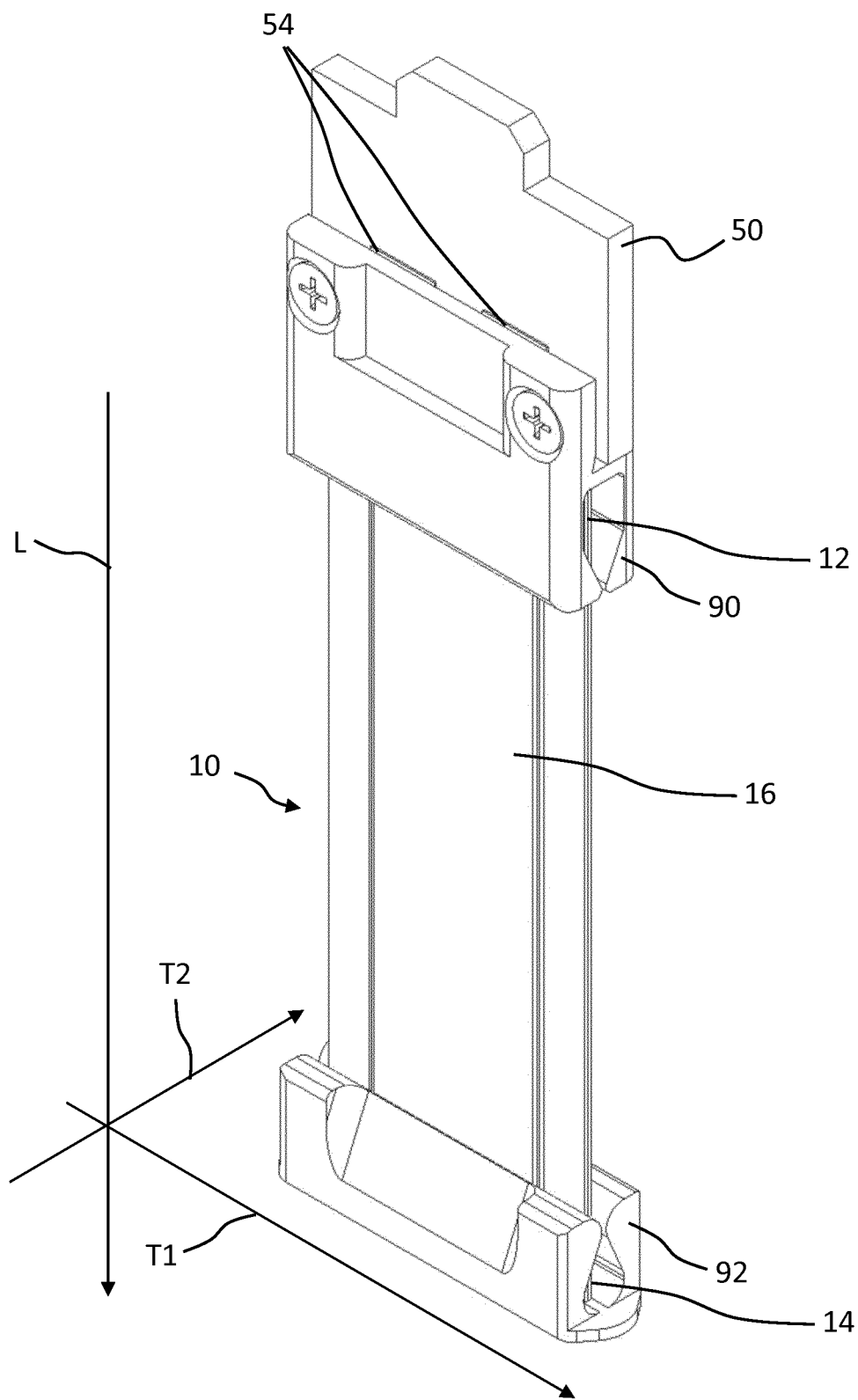
FIG. 3 shows a schematic illustration of a sensor device.

FIG. 3 shows a schematic illustration of a sensor device 10. The sensor device 10 is attached to a sensor printed circuit board 50 of the sensor assembly. The sensor device is attached to the sensor printed circuit board 50 by a first clamp member 90.

The first clamp member 90 is attached to a first attachment part 12 of the sensor device 10. A second attachment part 14 of the sensor device 10 is further attached by a second clamp member 92. Terminals 54 of the sensor device 10 is connected with rigid terminals (not visible) of the sensor printed circuit board 50.

Figure 4:
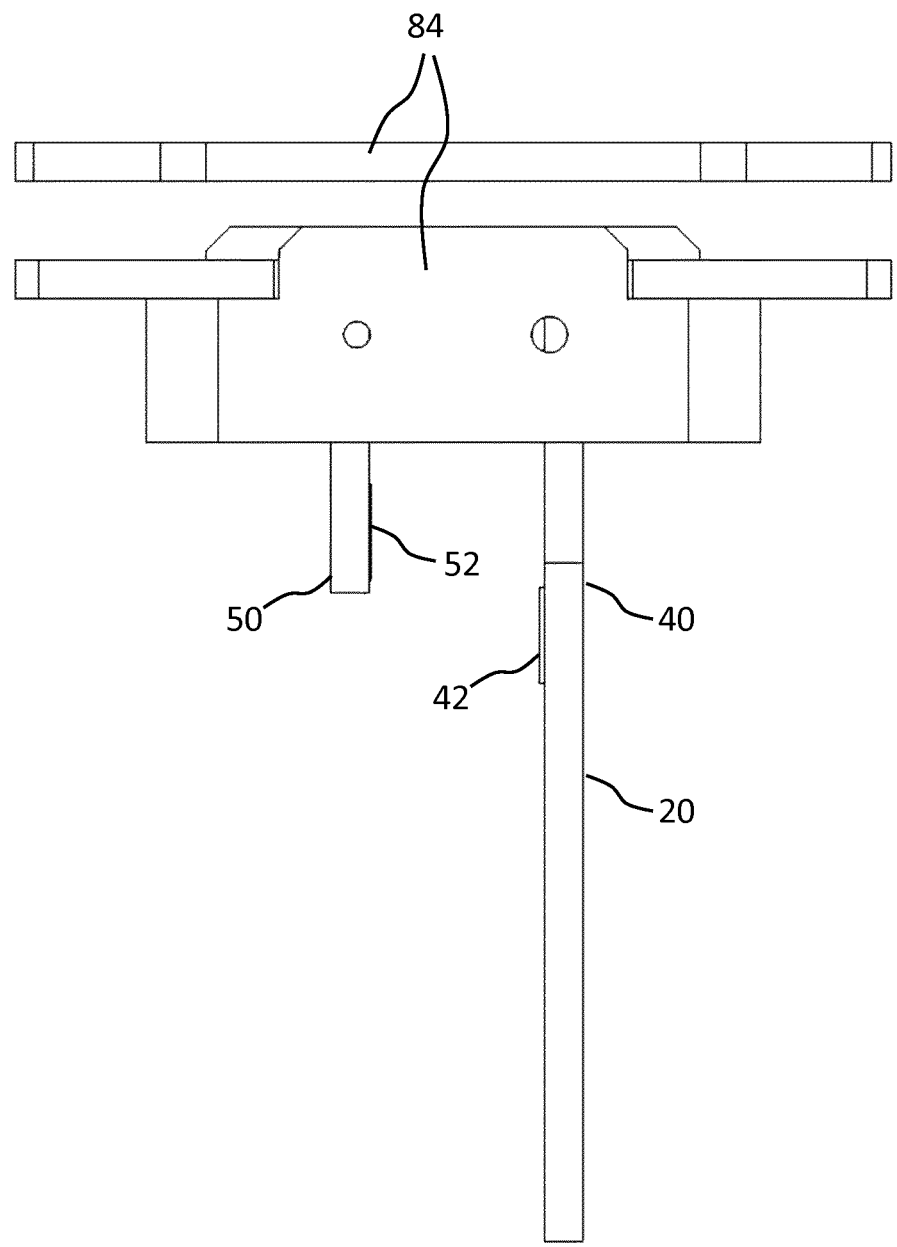
FIG. 4 shows a schematic illustration of exemplary printed circuit boards.

A longitudinal direction L of the sensing device 10 is illustrated, being from the first attachment part 12 to the second attachment part 14. A first transverse direction T1 is illustrated, being perpendicular to the longitudinal direction L. A second transverse direction T2 is illustrated, being perpendicular to the longitudinal direction L and the first transverse direction T1, FIG. 4 shows a schematic illustration of exemplary printed circuit boards 40, 50, 84 of the sensor assembly. The compensation printed circuit board 40 comprises rigid terminals 42 for connecting with terminals of the compensation sensor. The compensation sensor structure 20 may form part of the compensation printed circuit board 40. The sensor printed circuit board 50 comprises rigid terminals 52 for connecting with terminals of the sensor device. The compensation printed circuit board 40 and the sensor printed circuit board 50 is connected to one or more controller printed circuit boards 84. The controller printed circuit board 84 may comprise a processing unit, such as processing circuits, e.g. for retrieving and processing the sensor signal and/or the compensation signal. The printed circuit boards 40, 50, 84 may be connected without the use of wires, e.g. to prevent wiring generating undesired electrical noise.

Figure 5:
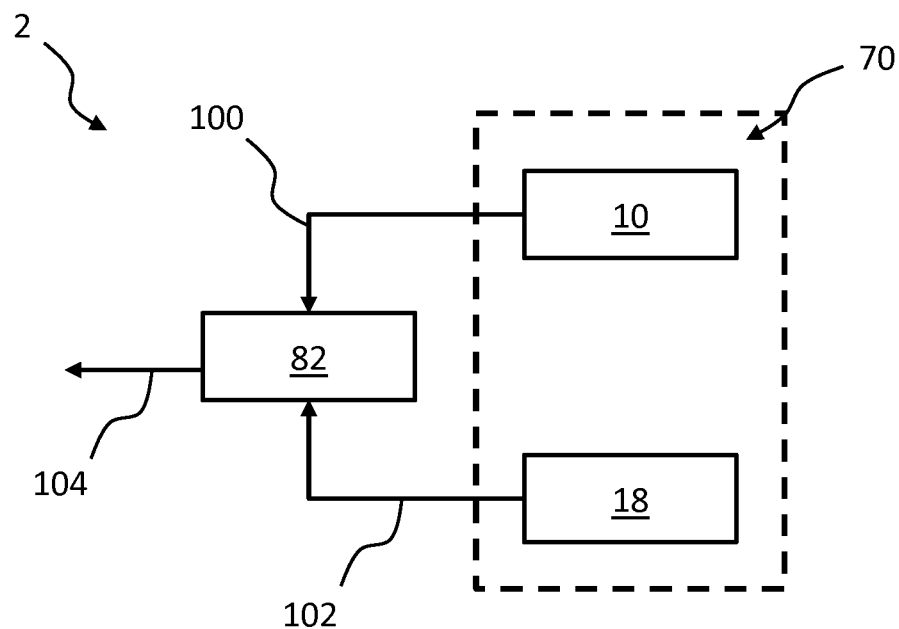
FIG. 5 shows a block diagram of exemplary signal processing.

FIG. 5 shows a block diagram of exemplary signal processing of an exemplary sensor assembly 2. The sensor device 10 and compensation sensor 18 are provided in the sensor cavity 70. The sensor device 10 provides a sensor signal 100. The sensor signal 100 may be based on capacitance of the sensing part. The sensor signal 100 is indicative of stretching of the sensing part. The sensor device, and thereby the sensor signal 100, may also be influenced by environmental conditions in the sensor cavity, such as temperature, pressure, and/or humidity.

The compensation sensor 18 provides a compensation signal 102. The compensation signal 102 may be based on capacitance of the compensation part. The compensation sensor 18, and thereby the compensation signal 102, may also be influenced by environmental conditions in the sensor cavity, such as temperature, pressure and/or humidity.

The sensor assembly 2 is configured to provide an output signal 104 being indicative of stretch of the sensing part of the sensor device 10. The sensor assembly may comprise a processing unit 82. The processing unit 82 receives the sensor signal 100 and the compensation signal 102. The processing unit 82 provides the output signal 104, e.g. based on the sensor signal 100 and the compensation signal 102. Thus, the output signal may be based on the sensor signal and the compensation signal. For example, the output signal 104 may be provided by subtracting the compensation signal 102 from the sensor signal 100. Other examples are provided in the summary part of the description.

Figure 6:
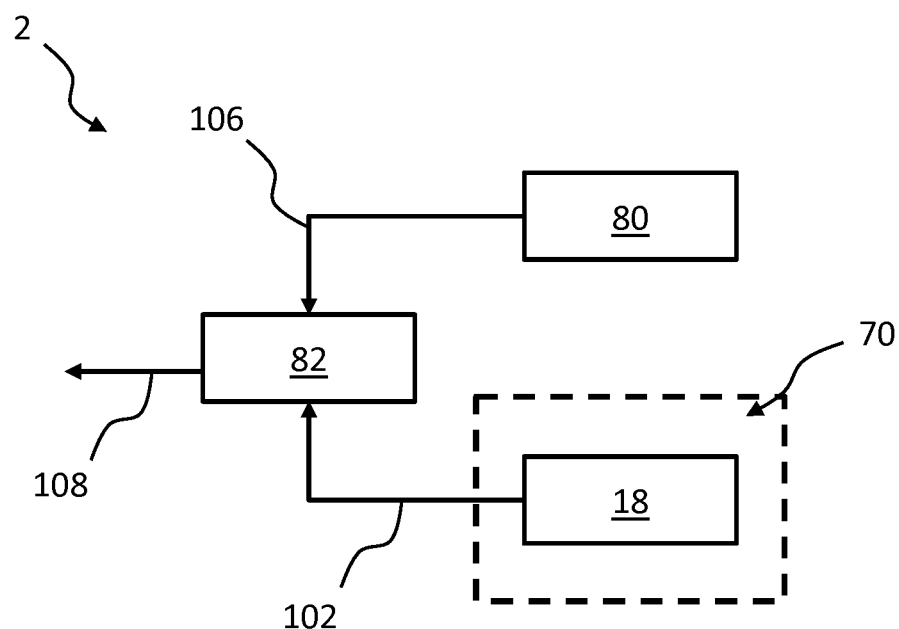
FIG. 6 shows a block diagram of exemplary signal processing.

FIG. 6 shows a block diagram of exemplary signal processing of an exemplary sensor assembly 2 comprising a reference sensor 80. The reference sensor 80 is shown being provided in combination with the compensation sensor 18, as also described in relation to previous figures. The reference sensor 80 may comprise a temperature sensor and/or a humidity sensor and/or a pressure sensor. The reference sensor 80 provides a reference signal 106. The reference signal may be indicative of measured temperature and/or humidity and/or pressure. The processing unit 82 receives the compensation signal 102 from the compensation sensor 18 and the reference signal 106 from the reference sensor 80. The processing unit 82 may thereby determine whether the compensation signal 102 is reasonable in view of the reference signal 106 being indicative of measured temperature and/or humidity and/or pressure.

The processing unit 82 as shown in FIG. 6 may be the same processing unit as shown in FIG. 5, as indicated. However, alternatively, the control signal 108 and the output signal 104 may be provided by different processing units.

Figure 7A:
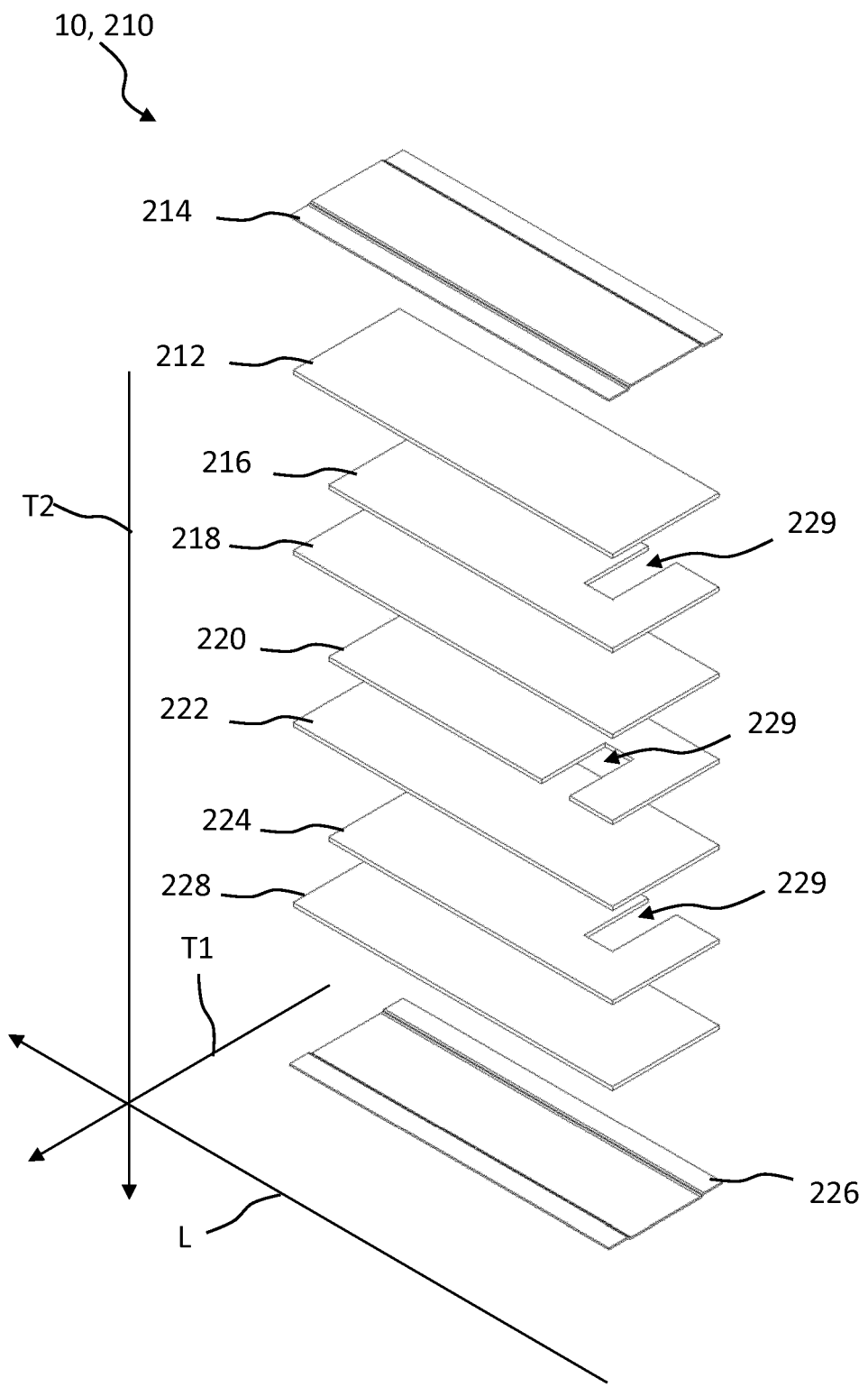
FIG. 7 shows schematic illustrations of exemplary layers of an exemplary sensor device.
Figure 7B:
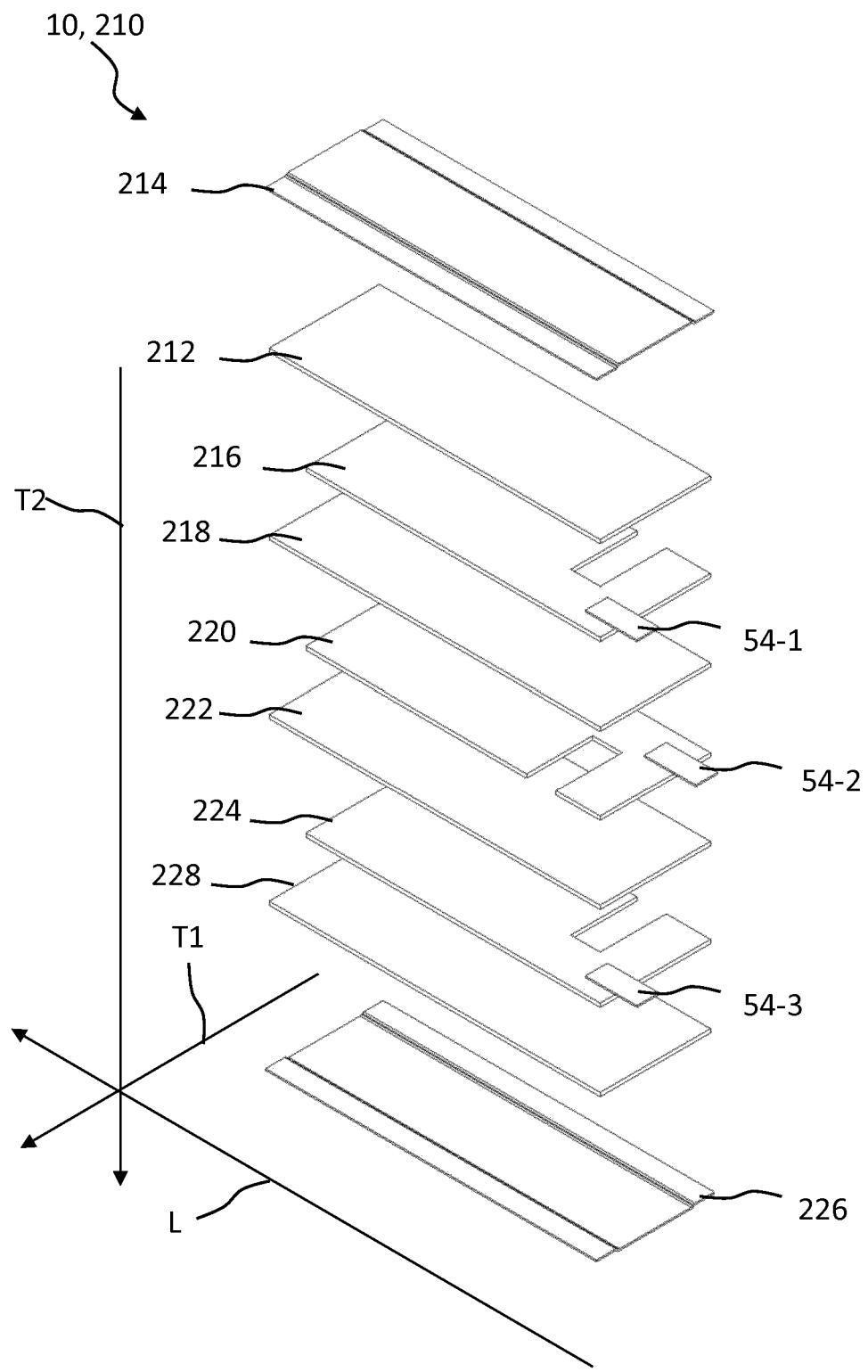
Figure 7C:
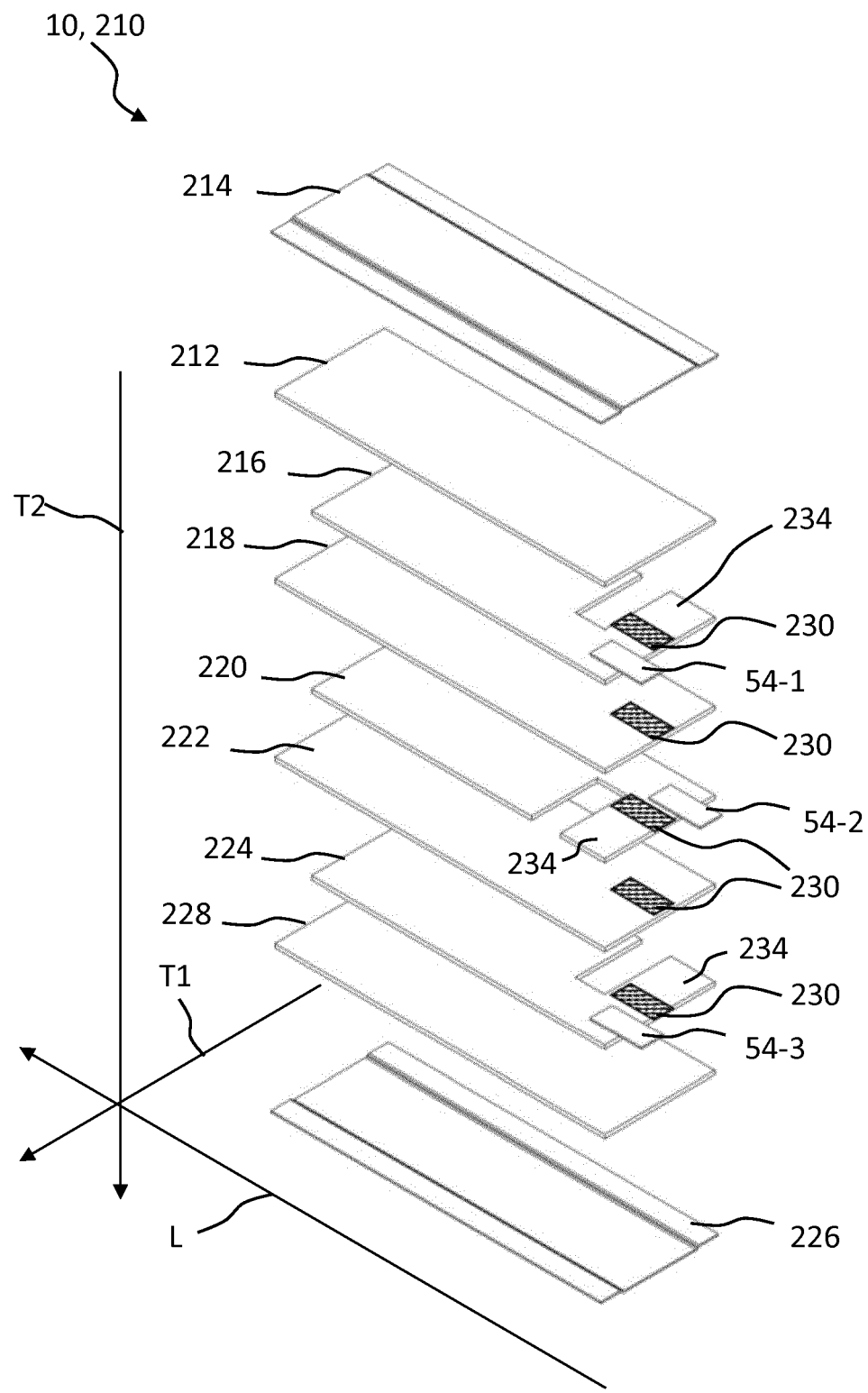

FIG. 7a-c show schematic illustrations of exemplary sensor layers 210 of an exemplary sensor device 10. The sensor layers 210 comprises a first primary protective layer 212, an optional first secondary protective layer 214, a first ground electrode layer 216, a first dielectric layer 218, a signal electrode layer 220, a second dielectric layer 222, a second ground electrode layer 224, an optional second secondary protective layer 226, and a second primary protective layer 228. The sensor layers 210 are arranged along the second transverse direction T2. The sensor layers 210 may be the same length along the longitudinal direction L. Alternatively, they may be of different length. The sensor layers 210 may be the same width along the first transverse direction T1. Alternatively, they may be of different width. The first secondary protective layer 214 and/or the second secondary protective layer 226 may have a width wider than the other sensor layers. The first primary protective layer 212 and/or the second primary protective layer 228 may have a width wider than the other sensor layers, such as the intermediate sensor layers, such as the first ground electrode layer 216, the first dielectric layer 218, the signal electrode layer 220, the second dielectric layer 222, and/or the second ground electrode layer 224. The wider width of the primary and/or secondary protective layers 212, 214, 226, 228 may provide a more uniform stress concentration at the intermediate layers.

Capacitance is measured between the signal electrode layer 220 and the ground electrode layers 216, 224. The capacitance is measured between the signal electrode layer 220 and the ground electrode layers 216, 224 where these overlap. Cutout sections 229 are provided on the electrode layers 216, 220, 224.

The sensor device 10, is elastically deformable, at least along the longitudinal direction. Stretching the sensor device 10 along the longitudinal direction will change the geometrical dimensions of the dielectric layers 218, 222 thereby changing the capacitance measured between the signal electrode layer 220 and the ground electrode layers 216, 224. The amount of stretching of the sensor device is therefore measurable by measuring the capacitance between the signal electrode layer 220 and the ground electrode layers 216, 224.

The first primary protective layer 212 and/or the second primary protective layer 228 may be a dielectric layer. For example, the first primary protective layer 212 and/or the second primary protective layer 228 may be the same material as the first dielectric layer 218 and/or the second dielectric layer 222.

FIG. 7a shows the exemplary sensor layers 210 of the exemplary sensor device 10.

FIG. 7b shows the exemplary sensor layers 210 with attached terminals 54 (54-1, 54-2, 54-3). The terminals 54 are attached to the electrode layers 216, 220, 224. The terminals 54 may be glued to the electrode layers by conductive glue. A first ground terminal 54-1 is attached to the first ground electrode layer 216. A signal terminal is attached to the signal electrode layer 220. A second ground terminal 54-3 is attached to the second ground electrode layer 224.

FIG. 7c shows the exemplary sensor layers 210 with punched zones 230. The punched zones 230 are removed to prevent overlap of the electrode layers 216, 220, 224 within before the cutout section 229. Thereby a non-sensing zone is provided before the cutout section 229. In the non-sensing zone, no overlap is provided between the part of the ground electrode layers 216, 224 connected to ground terminals 54-1, 54-3 and the part of the signal electrode layer 220 connected to the signal terminal 54-2. The non-sensing zone may provide for an attachment part of the sensor device 10, such as a first attachment part. Non-connected electrode parts 234 may be left to provide for enhanced stability of the sensor device 10, e.g. to avoid detachment or de-lamination of the first primary protective layer 212 from the first dielectric layer 218 and/or detachment or de-lamination of the first dielectric layer 218 from the second dielectric layer 222 and/or detachment or de-lamination of the second dielectric layer 222 from the second primary protective layer 228. A sensing zone is provided where the part of the ground electrode layers 216, 224 connected to ground terminals 54-1, 54-3 overlap the part of the signal electrode layer 220 connected to the signal terminal 54-2.

The punched zones 230 may be removed after assembly of the first ground electrode layer 216, the first dielectric layer 218, the signal electrode layer 220, the second dielectric layer 222, and the second ground electrode layer 224. Alternatively, removal of the punched zones 230 from the dielectric layers 218, 222 may be omitted.

The electrical conductive layers, such as the first ground electrode layer 216, the signal electrode layer 220 and/or the second ground electrode layer 224 may be a conductive glue. The electrical conductive layers, such as the first ground electrode layer 216, the signal electrode layer 220 and/or the second ground electrode layer 224 may glue the neighbouring layers together.

The electrical conductive layers, such as the first ground electrode layer 216, the signal electrode layer 220 and/or the second ground electrode layer 224 may be sprayed, printed, or coated by similar processes onto a neighbouring layer, such as a dielectric layer. The cutout sections 229 and/or the punched zones 230 of the electrode layers 216, 220, 224 may be achieved by spraying, printing, or coating by similar processes onto a mask leaving the electrode layer with the desired pattern.

Figure 8:
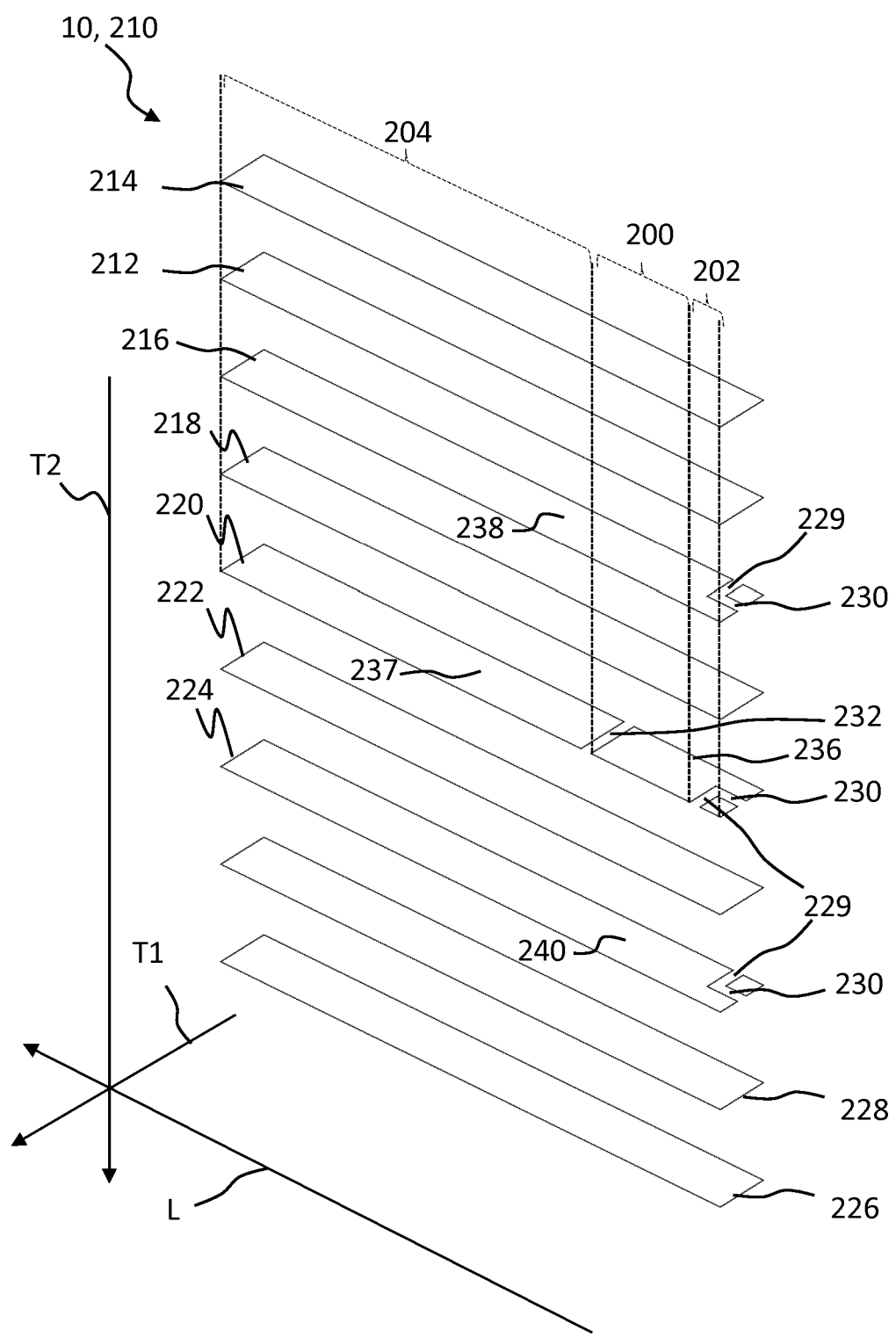
FIG. 8 shows a schematic illustration of exemplary layers of an exemplary sensor device.

FIG. 8 shows a schematic illustration of exemplary layers 210 of an exemplary sensor device 10. The sensor layers 210 comprises a first primary protective layer 212, an optional first secondary protective layer 214, a first ground electrode layer 216, a first dielectric layer 218, a signal electrode layer 220, a second dielectric layer 222, a second ground electrode layer 224, an optional second secondary protective layer 226, and a second primary protective layer 228. The sensor layers 210 are arranged along the second transverse direction T2. The sensor layers 210 may be the same length along the longitudinal direction L. Alternatively, they may be of different length. The sensor layers 210 may be the same width along the first transverse direction T1. Alternatively, they may be of different width. Particularly, the first primary protective layer 212 and/or the second primary protective layer 228 may have a width wider than the other sensor layers.

A first non-sensing zone 202 is provided by the punched zones 230 and the cutout sections 229. A sensing zone 200 is provided by the overlapping sections of an active signal part 236 of the signal electrode layer 220 and the first ground electrode layer 216 and/or the second ground electrode layer 224.

The signal electrode layer 220 comprises a void section 232. The void section 232 provides an electrically insulating gap in the signal electrode layer 220. The void section 232 provides for the signal electrode layer 220 comprising the active signal part 236 and a non-active signal part 237. The active signal part 236 is connected to a terminal (not shown). Thereby, a second non-sensing zone 204 is provided after the sensing zone 200.

A void section may also be provided in the first ground electrode layer 216, the first dielectric layer 218, the signal electrode layer 220, the second dielectric layer 222, and/or the second ground electrode layer 224. For example, the void section may be provided after assembly of the first ground electrode layer 216, the first dielectric layer 218, the signal electrode layer 220, the second dielectric layer 222, and/or the second ground electrode layer 224. Providing a void section in more layers may provide for an easier manufacture. Providing a void section only in a few layers, such as only in the signal electrode layer, may provide more mechanical strength, and a more uniform mechanical strength.

Capacitance is measured between the signal electrode layer 220 and the ground electrode layers 216, 224. The capacitance is measured between the signal electrode layer 220 and the ground electrode layers 216, 224 where these overlap. More particularly, the capacitance is measured between active ground parts 238, 240 of the ground electrode layers 216, 224 and the active signal part 236 of the signal electrode layer. The overlap between the active signal part 236 and the first active ground part 238 and/or the second active ground part defines the sensing zone 220. The active signal part 236 and the active ground parts 238, 240 are connected to terminals (not shown).

The second non-sensing zone 204, provided by the void section 232, provides that the capacitance is measured only in a limited length of the sensor device. Thus, the measurement of the capacitance may be independent of the length of the sensor device 10. Thus, providing for a higher precision for measurements over longer distances.

To ease production and/or to maintain the elastic properties of the entire length of the sensor device 10, the signal electrode layer 220 may be maintained also for the second non-sensing part 204, as shown. Hence, the second non-sensing zone 204 comprises the same plurality of sensor layers 210 along the second transverse direction T2 as the sensing zone 200.

Figure 9:
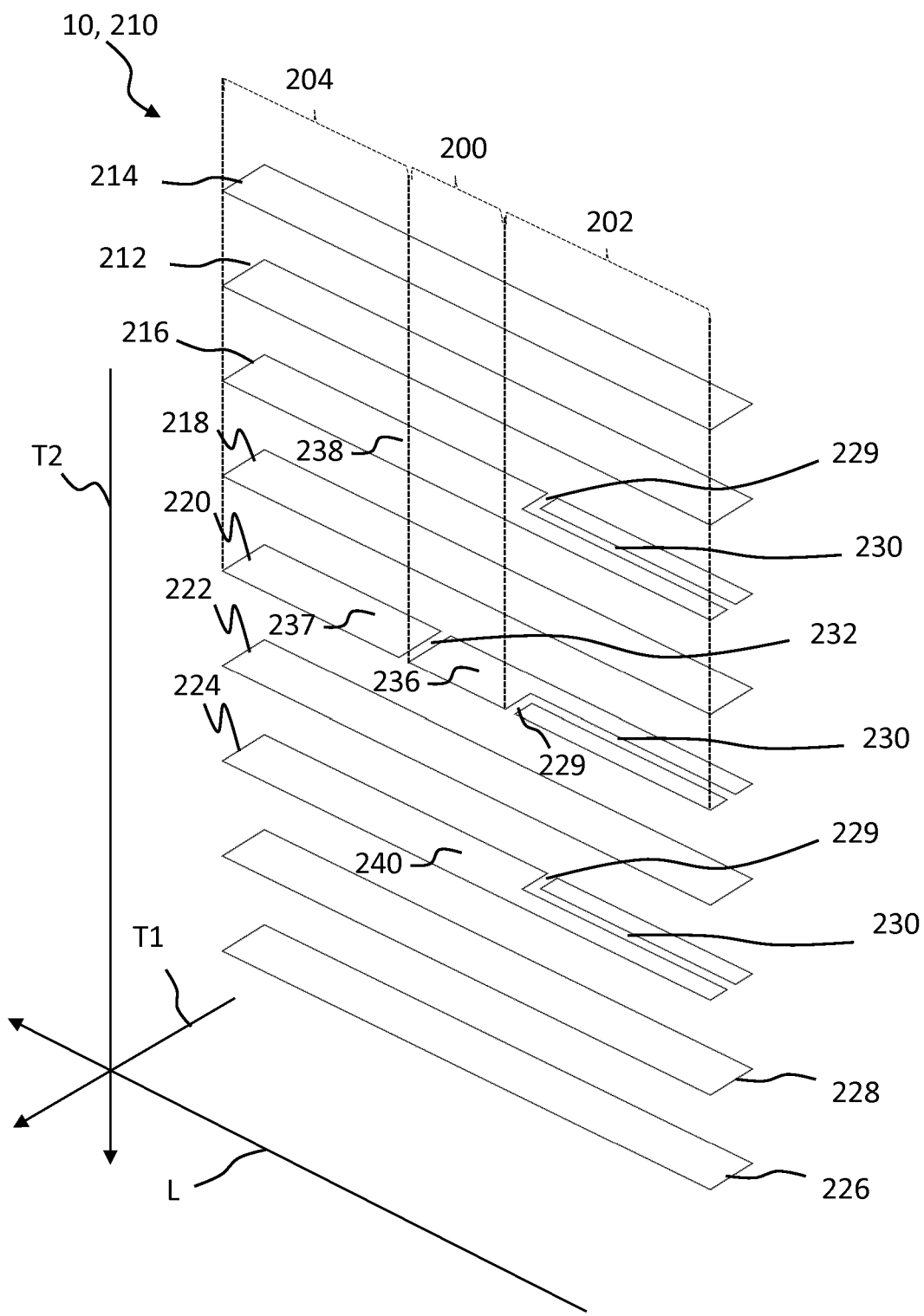
FIG. 9 shows a schematic illustration of exemplary layers of an exemplary sensor device.

FIG. 9 shows a schematic illustration of exemplary layers 210 of an exemplary sensor device 10. The sensor layers 210 comprises a first primary protective layer 212, an optional first secondary protective layer 214, a first ground electrode layer 216, a first dielectric layer 218, a signal electrode layer 220, a second dielectric layer 222, a second ground electrode layer 224, an optional second secondary protective layer 226, and a second primary protective layer 228. The sensor layers 210 are arranged along the second transverse direction T2. The sensor layers 210 may be the same length along the longitudinal direction L. Alternatively, they may be of different length. The sensor layers 210 may be the same width along the first transverse direction T1. Alternatively, they may be of different width. In particular, the first primary protective layer 212 and/or the second primary protective layer 228 may have a width wider than the other sensor layers.

As for the exemplary sensor device shown in relation to the previous figure, a first non-sensing zone 202 is provided by the punched zones 230 and the cutout sections 229. A second non-sensing zone 204 is provided by a void section 232 in the signal electrode layer 220. The first ground electrode layer 216 comprises a first active ground part 238. The second ground electrode layer 224 comprises a second active ground part 240. The signal electrode layer 220 comprises an active signal part 236 and a non-active signal part 237. The overlap between the active signal part 236 and the first active ground part 238 and/or the second active ground part 240 defines the sensing zone 220. The active signal part 236 and the active ground parts 238, 240 are connected to terminals (not shown).

As compared to the example shown in the previous figure, the first non-sensing zone 202 is longer, thereby providing the sensing zone 200 a further distance away from the end of sensor device 10, e.g. a further distance away from a first attachment part of the sensor device 10. Thereby, the sensing zone 200 may be provided in a part of the sensor device 10 being subjected to more uniform stress upon stretching.

Figure 10A:
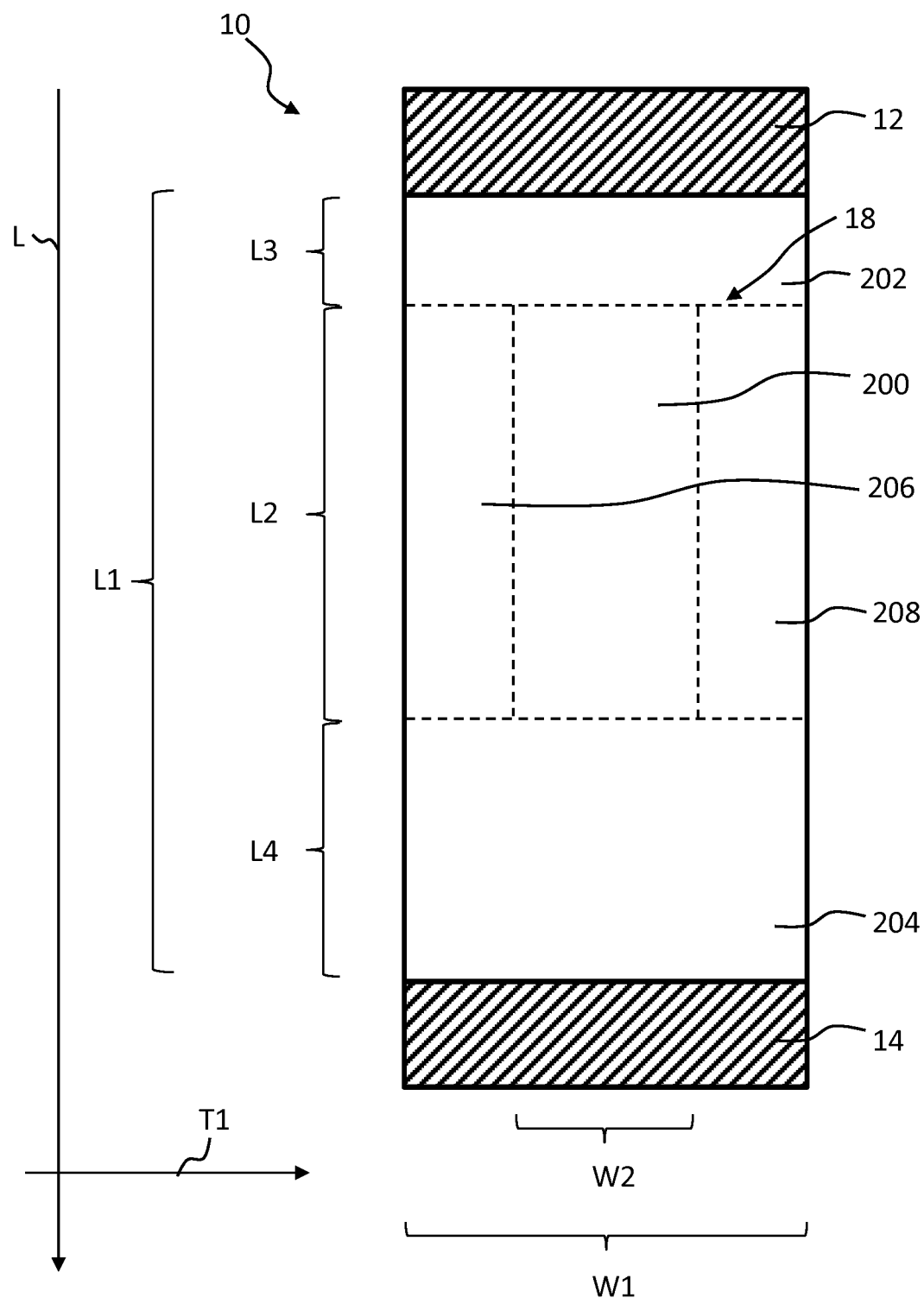
FIG. 10 shows a schematic illustration of an exemplary sensor device.
Figure 10B:
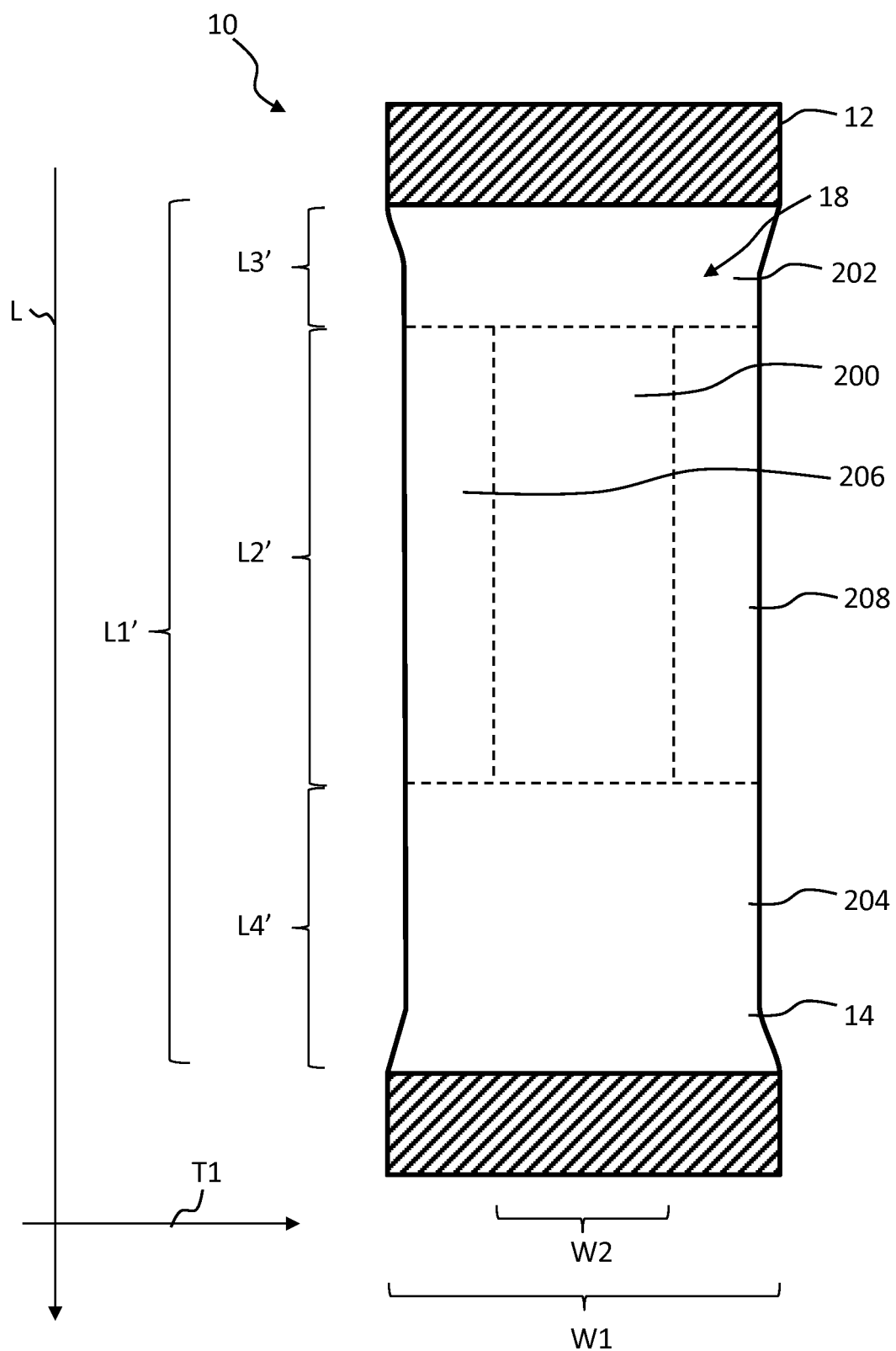

FIG. 10 shows a schematic illustration of an exemplary sensor device 10. The sensor device 10 may comprise sensor layers as exemplified in relation to any of the previous figures. FIG. 10a shows the sensor device 10 in an unstressed configuration. FIG. 10b shows the sensor device 10 wherein the sensor device 10 has been stretched.

The sensor device 10 comprises a first attachment part 12 and a second attachment part 14. The sensor device 10 comprises a sensing part 18 arranged between the first attachment part 12 and the second attachment part 14. The attachment parts 12, 14 are configured for attaching the ends of the sensor device, such as attaching the ends to mounting devices of a sensor assembly. The attachment parts 12, 14 may be distinct parts of the sensor device 10, and/or the attachment parts 12, 14 may have structurally different properties than the sensing part 18. Alternatively, the attachment parts 12, 14 are part of a respective first non-sensing zone 202 and second non-sensing zone 204.

The sensor device 10, such as the sensing part 18, comprises a sensing zone 200. The sensing zone provides a zone of the sensing part 18, wherein capacitance is measured to determined elongation of the sensor device 10, as explained in more detail in relation to previous figures.

The sensor device 10, such as the sensing part 18, comprises a plurality of non-sensing zones 202, 204, 206, 208, such as a first non-sensing zone 202, a second non-sensing zone 204, a third non-sensing zone 206, and a fourth non-sensing zone 208. In alternative exemplary sensor devices, one or more of the shown non-sensing zones may be omitted.

The sensing part 18 has a length L1 along the longitudinal direction L. The sensing zone 200 has a length L2 along the longitudinal direction L. The first non-sensing zone 202 has a length L3 along the longitudinal direction L. The second non-sensing zone 204 has a length L4 along the longitudinal direction L. The length L2 of the sensing zone 200 is shorter than the length of the sensing part 18. The length L4 of the second non-sensing zone 204 may be longer than the length L3 of the first non-sensing zone 202.

The sensing part 18 has a width W1 along the first transverse direction T1. The sensing zone 200 has a width W2 along the first transverse direction T1. The width W2 of the sensing zone 200 is less than the width W1 of the sensing part 18. The sensing zone 200 may be provided with non-sensing zones 206, 208, such as the third non-sensing zone 206 and the fourth non-sensing zone on each side, as illustrated.

As illustrated in FIG. 10b wherein the sensor device 10 is stretched along the longitudinal direction L, by providing non-sensing zones 206, 208 on each side of the sensing zone, the sensing zone may be removed from parts of the sensing part 18 experiencing non-linear deformation upon stretching of the sensor device 10. Hence, the sensing zone 200 is almost only elongated, while the non-sensing zones 202, 204, 206, 208 experience non-linear deformations.

Figure 11:
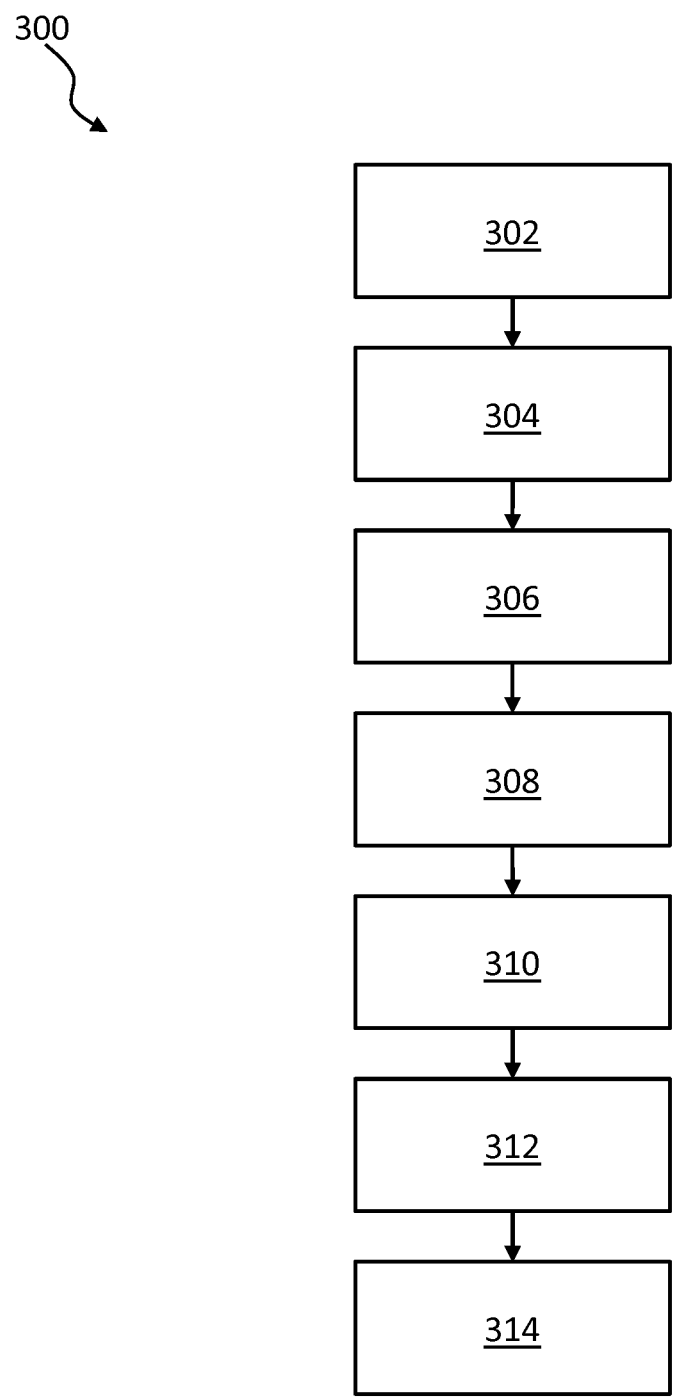
FIG. 11 shows a block diagram of an exemplary method.

FIG. 11 shows a block diagram of an exemplary method 300, such as a method of determining displacement between a first fixation part and a second fixation part with a sensor assembly, such as a sensor assembly as described in relation to previous figures.

The method 300 comprises mounting 302 a first mounting device of the sensor assembly to the first fixation part. For example, the first mounting device may be bolted to the first fixation part.

The method 300 comprises mounting 304 a second mounting device of the sensor assembly to the second fixation part. For example, the second mounting device may be bolted to the second fixation part.

The method 300 comprises arranging 306 in a sensor cavity a sensing part of the sensor device between the first mounting device and the second mounting device. The sensor cavity may be protected by a cover structure. Hence, the sensor cavity may be defined by the first mounting device, the second mounting device and the cover structure.

The method 300 comprises arranging 308 in the sensor cavity a compensation sensor comprising a compensation part. The compensation sensor may be arranged 308 in the sensor cavity in order to be subjected to the same conditions, such as environmental conditions, as the sensor device.

The method 300 comprises obtaining 310 a sensor signal from the sensor device. The sensor signal may be indicative of a measured capacitance of the sensor part. The sensor signal may be indicative of stretching of the sensor part.

The method 300 comprises obtaining 312 a compensation signal from the compensation sensor. The sensor signal may be indicative of a measured capacitance of the compensation part.

The method 300 comprises determining 314 a displacement parameter based on the sensor signal and the compensation signal. The displacement parameter may be based on the sensor signal compensated for environmental conditions, such as pressure, humidity and/or temperature, indicated by the compensation signal. For an example of determining 314 the displacement parameter, see e.g. FIG. 5.

Figure 12:
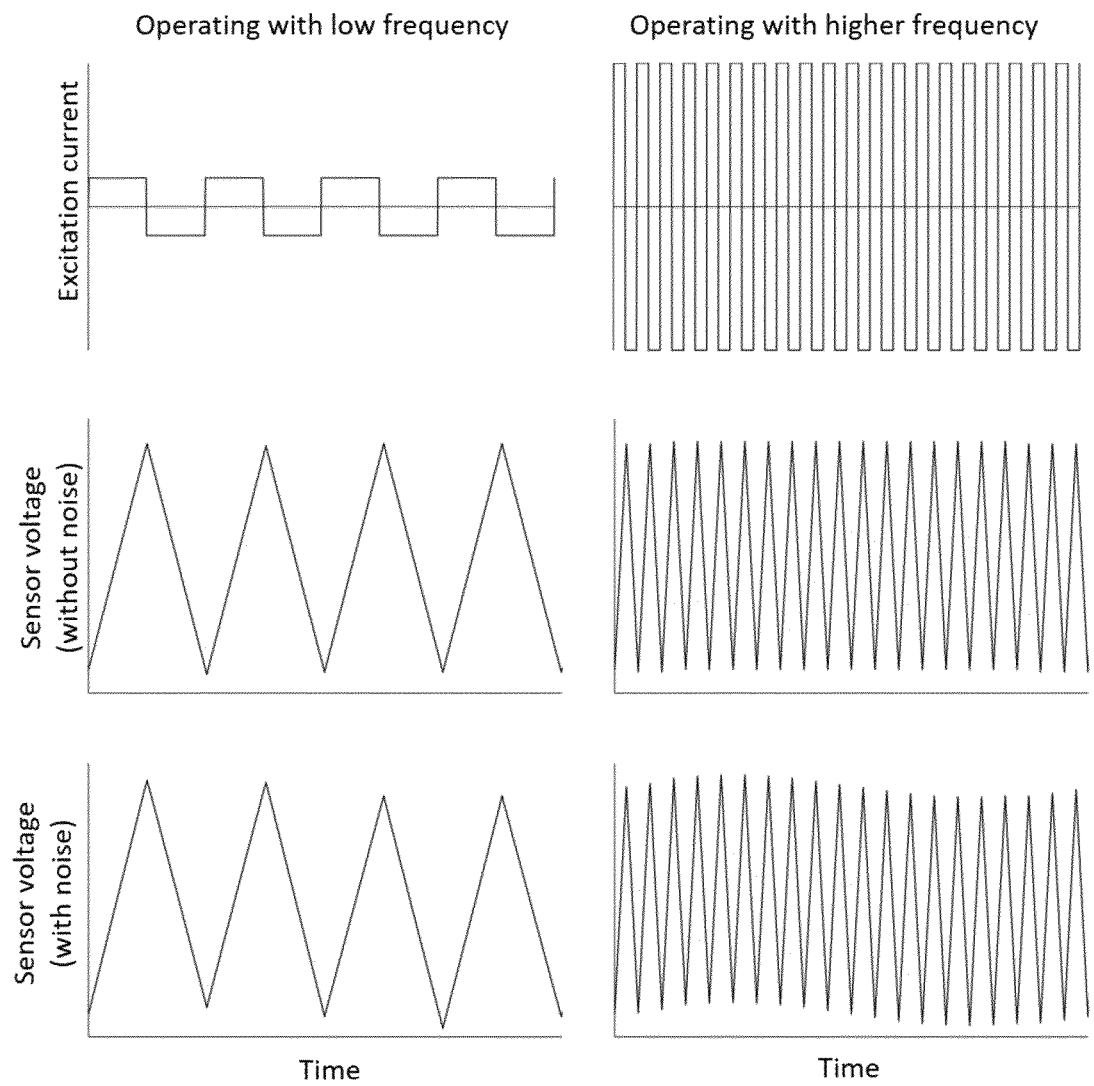
FIG. 12 shows a diagram of exemplary readings of an exemplary sensor device.

FIG. 12 shows a diagram of exemplary simulated readings of an exemplary sensor device. Upon measuring the capacitance of the sensing part of the sensor device, such as the sensing zone of the sensing part, a constant pulse current is applied to the sensor device (shown in the top graphs), and voltage across the sensor (shown in the bottom graphs), e.g.

between the ground electrode layers and the signal electrode layer, is measured. The rate of the voltage change indicates the capacitance.

The left graphs show a simulated example wherein the excitation current is of a low frequency, while the right graphs show a simulated example wherein the excitation current is of a higher frequency and the current is of a higher amplitude.

The bottom graphs show the measured sensor voltage including noise, e.g. 50 Hz noise, while the middle graphs show the true sensor voltage.

As may be visible, from the bottom left graph, the rate of the voltage change is slightly different between the slopes, which means that the capacitance readings will be affected. To compensate for this problem, a higher excitation current frequency and a higher current amplitude may be used, as shown in the right figures. For example, the excitation current frequency may be 10.000 Hz.

Also disclosed are sensor devices according to any of the following items.

Item 1. A sensor device for provision of a sensor signal, the sensor device comprising a first attachment part for attachment to a first mounting device, a second attachment part for attachment to a second mounting device, and a sensing part arranged between the first attachment part and the second attachment part, a longitudinal direction of the sensing device being from the first attachment part to the second attachment part, a first transverse direction being perpendicular to the longitudinal direction, a second transverse direction being perpendicular to the longitudinal direction and the first transverse direction, wherein the sensing part comprises a sensing zone and one or more non-sensing zones, wherein the sensor signal is indicative of stretching of the sensing zone.

Item 2. Sensor device according to item 1, wherein the length of the sensing zone in the longitudinal direction is less than the length of the sensing part in the longitudinal direction.

Item 3. Sensor device according to any of the preceding items, wherein the first attachment part is joined to a first non-sensing zone of the one or more non-sensing zones, the sensing zone being joined to the first non-sensing zone.

Item 4. Sensor device according to any of the preceding items, wherein the second attachment part is joined to a second non-sensing zone of the one or more non-sensing zones, the sensing zone being joined to the second non-sensing zone.

Item 5. Sensor device according to any of items 3 or 4, wherein the length of the first non-sensing zone and/or the second non-sensing zone in the longitudinal direction is more than 20% of the width of the sensing part along the first transverse direction.

Item 6. Sensor device according to any of the preceding items, wherein the width of the sensing zone in the first transverse direction is less than the width of the sensing part in the first transverse direction.

Item 7. Sensor device according to item 6, wherein the width of the sensing zone along the first transverse direction is less than 80% of the width of the sensing part along the first transverse direction.

Item 8. Sensor device according to any of the preceding items, wherein the sensing zone is arranged along the first transverse direction between a third non-sensing zone and a fourth non-sensing zone of the one or more non-sensing zones.

Item 9. Sensor device according to any of the preceding items, wherein the sensor signal is based on capacitance of the sensing part.

Item 10. Sensor device according to any of the preceding items, wherein stiffness of the sensing zone and stiffness of one or more of the one or more non-sensing zones are different.

Item 11. Sensor device according to any of the preceding items, wherein stiffness of the sensing zone is less than stiffness of one or more of the one or more non-sensing zones.

Item 12. Sensor device according to any of the preceding items, wherein the sensing part and/or sensing zone comprises a plurality of sensor layers along the second transverse direction.

Item 13. Sensor device according to item 12, wherein the one or more of the one or more non-sensing zones comprises the plurality of sensor layers along the second transverse direction, wherein the one or more of the one or more non-sensing zones comprises a void section joining the sensing zone, wherein the void section provides an electrically insulating gap between the one or more of the one or more non-sensing zones and the sensing zone.

Item 14. Sensor device according to any of items 12-13, wherein the plurality of sensor layers comprises a first ground electrode layer and a signal electrode layer, the first ground electrode layer having a first active ground part being connected to a first terminal and the signal electrode layer having an active signal part being connected to a second terminal, wherein the first active ground part and the active signal part are overlapping throughout the sensing zone.

LIST OF REFERENCES 2 sensor assembly
4 first mounting device
8 second mounting device
10 sensor device
12 first attachment part
14 second attachment part
16 sensing part
18 compensation sensor
20 compensation sensor structure
22 compensation part
24 suspension arrangement
26 first suspension opening
28 first mesh
30 first surface of compensation part
32 second suspension opening
34 second mesh
36 second surface of compensation part
40 compensation printed circuit board
42 rigid terminals of compensation printed circuit board
44 terminals of compensation sensor
50 sensor printed circuit board
52 rigid terminals of sensor printed circuit board
54 terminals of sensor device
54-1 first ground terminal
54-2 signal terminal
54-3 second ground terminal
70 sensor cavity
72 cover structure
74 first end of cover structure
76 second end of cover structure
80 reference sensor
82 processing unit 84 controller printed circuit board
90 first clamp member
92 second clamp member
100 sensor signal
102 compensation signal
104 output signal
106 reference signal
108 control signal
200 sensing zone
202 first non-sensing zone
204 second non-sensing zone
206 third non-sensing zone
208 fourth non-sensing zone
210 sensor layers
212 first primary protective layer
214 first secondary protective layer
216 first ground electrode layer
218 first dielectric layer
220 signal electrode layer
222 second dielectric layer
224 second ground electrode layer
226 second secondary protective layer
228 second primary protective layer
229 cutout section
230 punched zones
232 void section
234 non-connected electrode part
236 active signal part
237 non-active signal part
238 first active ground part
240 second active ground part
300 method
302 mounting first mounting device
304 mounting second mounting device
306 arranging sensing part
308 arranging compensation sensor
310 obtaining sensor signal
312 obtaining compensation signal
314 determining displacement parameter
L longitudinal direction
T1 first transverse direction
T2 second transverse direction
L1 length of sensing part
L2 length of sensing zone
L3 length of first non-sensing zone
L4 length of second non-sensing zone
W1 width of sensing part
W2 width of sensing zone

The invention claimed is:

1. A sensor assembly comprising:
 a first mounting device for mounting the sensor assembly to a first fixation part;
 a second mounting device for mounting the sensor assembly to a second fixation part, the second fixation part being displaceable relative to the first fixation part, the sensor assembly configured to determine displacement between the first fixation part and the second fixation part;
 a sensor device arranged in a sensor cavity for provision of a sensor signal, the sensor device comprising a first attachment part attached to the first mounting device, a second attachment part attached to the second mounting device, and a sensing part, the sensing part being arranged between the first attachment part and the second attachment part, the sensing part including a plurality of polymeric sensor layers comprising a first dielectric layer, the sensing part comprising a sensing zone, wherein the sensor signal is indicative of stretching of the sensing zone;
 wherein the sensor assembly comprises a compensation sensor structure and a compensation sensor for provision of a compensation signal for compensating for changing environmental conditions, the compensation sensor being arranged in the sensor cavity and arranged to be restricted from mechanical deformation caused by relative displacement between the first fixation part and the second fixation part, the compensation sensor including a compensation part being supported by the compensation sensor structure.

2. Sensor assembly according to claim 1, wherein the compensation sensor is suspended in a suspension arrangement of the compensation sensor structure.

3. Sensor assembly according to claim 2, wherein the suspension arrangement comprises a first suspension opening for subjecting a first surface of the compensation part to environmental condition of the sensor cavity.

4. Sensor assembly according to claim 2, wherein the suspension arrangement comprises a second suspension opening for subjecting a second surface of the compensation part to environmental condition of the sensor cavity.

5. Sensor assembly according to claim 1, wherein the compensation sensor structure comprises a compensation printed circuit board having rigid terminals connected with terminals of the compensation sensor.

6. Sensor assembly according to claim 1, wherein the first mounting device comprises a sensor printed circuit board having rigid terminals connected with terminals of the sensor device.

7. Sensor assembly according to claim 1, wherein the sensing part comprises a capacitive sensing zone and wherein the compensation part comprises a capacitive compensation zone.

8. Sensor assembly according to claim 1, wherein the compensation part is made of the same material as the sensing part.

9. Sensor assembly according to claim 1, wherein the sensor assembly is configured to provide an output signal indicative of stretching of the sensing part.

10. Sensor assembly according to claim 9, wherein the output signal is based on the sensor signal and the compensation signal.

11. Sensor assembly according to claim 1, wherein the sensor signal is based on capacitance of the sensing part and the compensation signal is based on capacitance of the compensation part.

12. Sensor assembly according to claim 1, wherein the sensor assembly comprises a cover structure with a first end and a second end, wherein the first end is attached to the first mounting device and the second end is attached to the second mounting device.

13. Sensor assembly according to claim 12, wherein the sensor cavity is defined by the cover structure, the first mounting device and the second mounting device.

14. Sensor assembly according to claim 1, wherein the sensor assembly comprises a reference sensor comprising a temperature sensor, a pressure sensor, and/or a humidity sensor.

15. Method of determining displacement between a first fixation part and a second fixation part with a sensor assembly comprising a first mounting device, a second mounting device, a sensor device and a compensation sensor, the compensation sensor arranged to be restricted from mechanical deformation caused by relative displacement between the first fixation part and the second fixation part, the method comprising:
- mounting the first mounting device to the first fixation part;
- mounting the second mounting device to the second fixation part;
- arranging in a sensor cavity a sensing part of the sensor device between the first mounting device and the second mounting device, the sensing part including a plurality of polymeric sensor layers comprising a first dielectric layer, the sensing part comprising a sensing zone;
- arranging the compensation sensor comprising a compensation part, in the sensor cavity;

the method further comprising:
- obtaining a sensor signal from the sensor device, wherein the sensor signal is indicative of stretching of the sensing zone;
- obtaining a compensation signal from the compensation sensor;
- determining a displacement parameter based on the sensor signal and the compensation signal.

\* \* \* \* \*